(12) United States Patent
Yuan et al.

(10) Patent No.: US 11,887,683 B2
(45) Date of Patent: Jan. 30, 2024

(54) SHIFT REGISTER UNIT, DRIVING METHOD, GATE DRIVING CIRCUIT AND DISPLAY DEVICE

(71) Applicants: Hefei BOE Joint Technology Co., Ltd., Hefei (CN); BOE Technology Group Co., Ltd., Beijing (CN)

(72) Inventors: Zhidong Yuan, Beijing (CN); Yongqian Li, Beijing (CN); Can Yuan, Beijing (CN); Wenchao Bao, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 317 days.

(21) Appl. No.: 17/417,518

(22) PCT Filed: Dec. 29, 2020

(86) PCT No.: PCT/CN2020/140585
§ 371 (c)(1),
(2) Date: Jun. 23, 2021

(87) PCT Pub. No.: WO2021/184899
PCT Pub. Date: Sep. 23, 2021

(65) Prior Publication Data
US 2023/0260586 A1    Aug. 17, 2023

(30) Foreign Application Priority Data
Mar. 18, 2020 (CN) .......................... 202010191578.5

(51) Int. Cl.
*G11C 19/28* (2006.01)
*G09G 3/3266* (2016.01)

(52) U.S. Cl.
CPC ........... *G11C 19/28* (2013.01); *G09G 3/3266* (2013.01); *G09G 2310/0286* (2013.01)

(58) Field of Classification Search
CPC ......... G09G 3/3266; G09G 2310/0286; G11C 19/28
See application file for complete search history.

(56) References Cited

U.S. PATENT DOCUMENTS

2011/0228893 A1   9/2011  Tobita et al.
2015/0255031 A1*  9/2015  Cao ...................... G09G 3/3677
                                                              345/210
(Continued)

FOREIGN PATENT DOCUMENTS

CN        105761758 A    7/2016
CN        106023946 A   10/2016
(Continued)

OTHER PUBLICATIONS

CN2020101915785 first office action.
PCT/CN2020/140585 international search report and written opinion.

*Primary Examiner* — Hong Zhou
(74) *Attorney, Agent, or Firm* — IPro, PLLC

(57) ABSTRACT

The present disclosure provides a shift register unit, a driving method, a gate driving circuit and a display device. The shift register unit includes a pull-down node control circuit; the pull-down node control circuit is electrically connected to an input terminal, a reset terminal, a first voltage terminal, a second voltage terminal and a pull-down node, respectively, and is configured to, under the control of an input signal provided by the input terminal and a reset signal provided by the reset terminal, control the pull-down node to be electrically conducted to the first voltage terminal (Continued)

or the second voltage terminal, and control to hold a potential of the pull-down node.

18 Claims, 10 Drawing Sheets

(56) References Cited

U.S. PATENT DOCUMENTS

| | | | |
|---|---|---|---|
| 2018/0040382 A1 | 2/2018 | Gu et al. | |
| 2019/0073932 A1* | 3/2019 | Huang | G09G 3/3666 |
| 2019/0371224 A1* | 12/2019 | Tao | G09G 3/20 |
| 2020/0143766 A1 | 5/2020 | Zhang | |
| 2020/0219428 A1 | 7/2020 | Yuan et al. | |
| 2020/0303028 A1 | 9/2020 | Gu et al. | |
| 2021/0150988 A1 | 5/2021 | Yuan et al. | |
| 2021/0335193 A1* | 10/2021 | Cong | G09G 3/2092 |

FOREIGN PATENT DOCUMENTS

| | | |
|---|---|---|
| CN | 107909980 A | 4/2018 |
| CN | 108399902 A | 8/2018 |
| CN | 109410825 A | 3/2019 |
| CN | 109767717 A | 5/2019 |
| CN | 110648621 A | 1/2020 |
| CN | 111179813 A | 5/2020 |
| CN | 111179858 A | 5/2020 |
| KR | 20110077108 A | 7/2011 |
| KR | 20140079106 A | 6/2014 |
| KR | 20180057975 A | 5/2018 |

\* cited by examiner

SHIFT REGISTER UNIT, DRIVING METHOD, GATE DRIVING CIRCUIT AND DISPLAY DEVICE

CROSS-REFERENCE TO RELATED APPLICATION

This application is the U.S. national phase of PCT Application No. PCT/CN2020/140585 filed on Dec. 29, 2020 which claims priority to Chinese Patent Application No. 202010191578.5 filed on Mar. 18, 2020, the disclosures of which are incorporated in their entirety by reference herein.

TECHNICAL FIELD

The present disclosure relates to the field of display technology, and in particular to a shift register unit, a driving method, a gate driving circuit and a display device.

BACKGROUND

In existing shift register units, an inverter is needed to control the potential of a pull-down node. This method requires a large number of TFTs (thin film transistors) to form an inverter. The large number of TFTs used is unfavorable for achieving high PPI (Pixels Per Inch, i.e., the number of pixels per inch). At the same time, the inverter is affected by the threshold voltage drift of the TFT, which will lead to lower circuit reliability.

SUMMARY

In an aspect, an embodiment of the present disclosure provides a shift register unit including a pull-down node control circuit;
the pull-down node control circuit being electrically connected to an input terminal, a reset terminal, a first voltage terminal, a second voltage terminal and a pull-down node, respectively, and being configured to, under the control of an input signal provided by the input terminal and a reset signal provided by the reset terminal, control the pull-down node to be electrically conducted to the first voltage terminal or the second voltage terminal, and control to hold a potential of the pull-down node.

Optionally, the pull-down node control circuit includes a first control sub-circuit, a second control sub-circuit, and an energy storage circuit;
the first control sub-circuit is electrically connected to the reset terminal, the pull-down node and the first voltage terminal, respectively, and is configured to, under the control of the reset signal, control the pull-down node to be electrically conducted to the first voltage terminal;
the second control sub-circuit is electrically connected to the input terminal, the pull-down node and the second voltage terminal, respectively, and is configured to, under the control of the input signal, control the pull-down node to be electrically conducted to the second voltage terminal;
the energy storage circuit is electrically connected to the pull-down node, and is configured to hold the potential of the pull-down node.

Optionally, the first control sub-circuit includes a first control transistor, the second control sub-circuit includes a second control transistor, the energy storage circuit includes a storage capacitor;

a control electrode of the first control transistor is electrically connected to the reset terminal, a first electrode of the first control transistor is electrically connected to the first voltage terminal, a second electrode of the first control transistor is electrically connected to the pull-down node;
a control electrode of the second control transistor is electrically connected to the input terminal, a first electrode of the second control transistor is electrically connected to the pull-down node, a second electrode of the second control transistor is electrically connected to the second voltage terminal;
a first terminal of the storage capacitor is electrically connected to the pull-down node, a second terminal of the storage capacitor is electrically connected to the second voltage terminal.

Optionally, the second control sub-circuit further includes a third control transistor;
the control electrode of the second control transistor is electrically connected to the second voltage terminal via the third control transistor;
a control electrode of the third control transistor is electrically connected to the input terminal, a first electrode of the third control transistor is electrically connected to the second electrode of the second control transistor, a second electrode of the third control transistor is electrically connected to the second voltage terminal.

Optionally, the reset signal provided by the reset terminal is a pull-down control clock signal.

Optionally, the shift register unit further includes a setting circuit, a pull-up node potential holding circuit, and N pull-up nodes;
the setting circuit includes N setting sub-circuits connected in series with each other, wherein N is an integer greater than or equal to 2; the pull-up node potential holding circuit includes N potential holding sub-circuits;
a control terminal of a first setting sub-circuit is electrically connected to the input terminal, a first terminal of the first setting sub-circuit is electrically connected to the first voltage terminal, a second terminal of the first setting sub-circuit is electrically connected to a first pull-up node, the first setting sub-circuit is configured to, under the control of the input signal, control the first pull-up node to be electrically conducted to the first voltage terminal;
a control terminal of an n-th setting sub-circuit is electrically connected to the input terminal, a first terminal of the n-th setting sub-circuit is electrically connected to an (n−1)-th pull-up node, a second terminal of the n-th setting sub-circuit is electrically connected to an n-th pull-up node; the n-th setting sub-circuit is configured to, under the control of the input signal, control the (n−1)-th pull-up node to be electrically conducted to the n-th pull-up node; n is an integer greater than 1 and less than or equal to N;
a first potential holding sub-circuit is electrically connected to the first pull-up node, and is configured to hold a potential of the first pull-up node;
an n-th potential holding sub-circuit is electrically connected to the n-th pull-up node, and is configured to hold a potential of the n-th pull-up node.

Optionally, the shift register unit further includes N gate drive signal output terminals; the first setting sub-circuit includes a first setting transistor; the n-th setting sub-circuit includes an n-th setting transistor; the first potential holding sub-circuit includes a first energy storage capacitor, the n-th potential holding sub-circuit includes an n-th energy storage capacitor;
  a control electrode of the first setting transistor is electrically connected to the input terminal, a first electrode of the first setting transistor is electrically connected to the first voltage terminal, a second electrode of the first setting transistor is electrically connected to the first pull-up node;
  a control electrode of the n-th setting transistor is electrically connected to the input terminal, a first electrode of the n-th setting transistor is electrically connected to the (n−1)-th pull-up node, a second electrode of the n-th setting transistor is electrically connected to the n-th pull-up node;
  a first terminal of the first energy storage capacitor is electrically connected to the first pull-up node, a second terminal of the first energy storage capacitor is electrically connected to a first gate drive signal output terminal;
  a first terminal of the n-th energy storage capacitor is electrically connected to the n-th pull-up node, a second terminal of the n-th energy storage capacitor is electrically connected to an n-th gate drive signal output terminal.

Optionally, the shift register unit further includes a pull-down circuit;
  the pull-down circuit is electrically connected to the pull-down node, the N pull-up nodes and the second voltage terminal, respectively, and is configured to, under the control of the potential of the pull-down node, control the N pull-up nodes to be electrically conducted to the second voltage terminal, respectively.

Optionally, the shift register unit includes a feedback circuit and a pull-down circuit;
  the pull-down circuit is electrically connected to the pull-down node, the N pull-up nodes and a feedback node, respectively, and is configured to, under the control of the potential of the pull-down node, control the N pull-up nodes to be electrically conducted to the feedback node, respectively;
  the feedback circuit is electrically connected to the first pull-up node, the feedback node, the first voltage terminal and the second voltage terminal, respectively, and is configured to, under the control of the potential of the first pull-up node, control the feedback node to be electrically conducted to the first voltage terminal, and under the control of the potential of the pull-down node, control the feedback node to be electrically conducted to the second voltage terminal.

Optionally, the feedback circuit includes a first feedback transistor and a second feedback transistor;
  a control electrode of the first feedback transistor is electrically connected to the first pull-up node, a first electrode of the first feedback transistor is electrically connected to the first voltage terminal, a second electrode of the first feedback transistor is electrically connected to the feedback node;
  a control electrode of the second feedback transistor is electrically connected to the pull-down node, a first electrode of the second feedback transistor is electrically connected to the feedback node, a second electrode of the second feedback transistor is electrically connected to the second voltage terminal.

Optionally, the shift register unit further includes a drive output circuit and N gate drive signal output terminals; the drive output circuit includes N drive output sub-circuits;
  a first drive output sub-circuit is electrically connected to a first gate drive signal output terminal, the first pull-up node, the pull-down node, a first output clock signal terminal and a third voltage terminal, respectively, and is configured to, under the control of the potential of the first pull-up node, control the first gate drive signal output terminal to be electrically conducted to the first output clock signal terminal, and under the control of the potential of the pull-down node, control the first gate drive signal output terminal to be electrically conducted to the third voltage terminal;
  an n-th drive output sub-circuit is electrically connected to an n-th gate drive signal output terminal, the n-th pull-up node, the pull-down node, an n-th output clock signal terminal and the third voltage terminal, respectively, and is configured to, under the control of the potential of the n-th pull-up node, control the n-th gate drive signal output terminal to be electrically conducted to the n-th output clock signal terminal, and under the control of the potential of the pull-down node, control the n-th gate drive signal output terminal to be electrically conducted to the third voltage terminal.

Optionally, the shift register unit further includes a carry signal output terminal and a carry signal output circuit;
  the carry signal output circuit is electrically connected to the first pull-up node, the pull-down node, a carry output clock signal terminal, the carry signal output terminal and the second voltage terminal, respectively, and is configured to, under the control of the potential of the first pull-up node, control the carry signal output terminal to be electrically conducted to the carry output clock signal terminal, and under the control of the potential of the pull-down node, control the carry signal output terminal to be electrically conducted to the second voltage terminal.

In a second aspect, an embodiment of the present disclosure further provide a driving method of a shift register unit for driving the above shift register unit, the driving method of a shift register unit including:
  the pull-down node control circuit controlling the pull-down node to be electrically conducted to the second voltage terminal, under the control of the input signal provided by the input terminal, the pull-down node control circuit controlling the pull-down node to be electrically conducted to the first voltage terminal, under the control of the reset signal provided by the reset terminal, and the pull-down node control circuit controlling to hold the potential of the pull-down node.

Optionally, the reset signal provided by the reset terminal is a pull-down control clock signal.

Optionally, the shift register unit further includes a setting circuit, a pull-up node potential holding circuit, and N pull-up nodes; the setting circuit includes N setting sub-circuits connected in series with each other, wherein N is an integer greater than or equal to 2; the pull-up node potential holding circuit includes N potential holding sub-circuits; the driving method of a shift register unit further includes:
  the first setting sub-circuit controlling the first pull-up node to be electrically conducted to the first voltage terminal, under the control of the input signal; a first potential holding sub-circuit holding a potential of the first pull-up node;
  the n-th setting sub-circuit controlling the (n−1)-th pull-up node to be electrically conducted to the n-th pull-up node, under the control of the input signal;
  an n-th potential holding sub-circuit holding a potential of the n-th pull-up node.

Optionally, the shift register unit includes a feedback circuit and a pull-down circuit;

the driving method of a shift register unit further includes:

the pull-down circuit controlling the N pull-up nodes to be electrically conducted to the feedback node, respectively, under the control of the potential of the pull-down node;

the feedback circuit controlling the feedback node to be electrically conducted to the first voltage terminal, under the control of the potential of the first pull-up node, and controlling the feedback node to be electrically conducted to the second voltage terminal, under the control of the potential of the pull-down node.

Optionally, the shift register unit further includes a drive output circuit and N gate drive signal output terminals; the drive output circuit includes N drive output sub-circuits; the driving method of a shift register unit further includes:

a first drive output sub-circuit controlling the first gate drive signal output terminal to be electrically conducted to the first output clock signal terminal, under the control of the potential of the first pull-up node, and controlling the first gate drive signal output terminal to be electrically conducted to the third voltage terminal, under the control of the potential of the pull-down node;

an n-th drive output sub-circuit controlling the n-th gate drive signal output terminal to be electrically conducted to the n-th output clock signal terminal, under the control of the potential of the n-th pull-up node, and controlling the n-th gate drive signal output terminal to be electrically conducted to the third voltage terminal, under the control of the potential of the pull-down node.

Optionally, the shift register unit further includes a carry signal output terminal and a carry signal output circuit; the driving method of a shift register unit further includes:

the carry signal output circuit controlling the carry signal output terminal to be electrically conducted to the carry output clock signal terminal, under the control of the potential of the first pull-up node, and controlling the carry signal output terminal to be electrically conducted to the second voltage terminal, under the control of the potential of the pull-down node.

In a third aspect, an embodiment of the present disclosure further provide a gate drive circuit including multiple stages of above shift register units;

the shift register unit includes a carry signal output terminal;

except for a first stage of shift register unit, an input terminal of each stage of shift register unit is electrically connected to the carry signal output terminal of an adjacent previous stage of shift register unit.

In a fourth aspect, an embodiment of the present disclosure further provide a display device including the above gate drive circuit.

DETAILED DESCRIPTION

Hereinafter, the technical solutions in the embodiments of the present disclosure will be described clearly and thoroughly in conjunction with the drawings in the embodiments of the present disclosure. Obviously, the described embodiments are merely some of the embodiments of the present disclosure, but not all of the embodiments. Based on the embodiments in the present disclosure, all other embodiments obtained by a person of ordinary skill in the art without creative efforts should fall within the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of a transistor other than the control electrode, one of the two electrodes is referred to as the first electrode, and the other is referred to as the second electrode.

In practical operations, if the transistor is a triode, the control electrode may be a base, the first electrode may be a collector, and the second electrode may be an emitter; or, the control electrode may be a base, the first electrode may be an emitter, and the second electrode may be a collector.

In practical operations, if the transistor is a thin film transistor or a field effect transistor, the control electrode may be a gate, the first electrode may be a drain, and the second electrode may be a source; or, the control electrode may be a gate, the first electrode may be a source, and the second electrode may be a drain.

Figure 1:
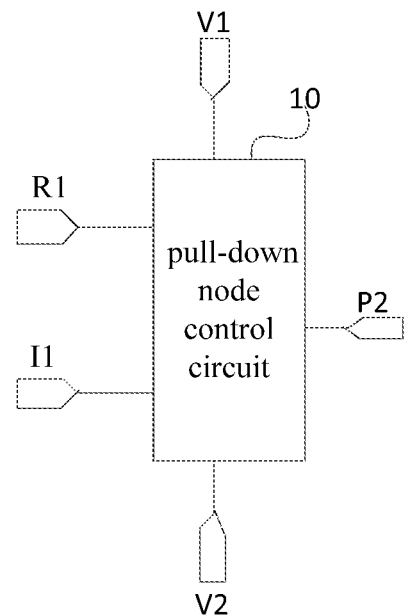
FIG. 1 is a structural diagram of a shift register unit according to at least one embodiment of the present disclosure.

As shown in FIG. 1, a shift register unit according to at least one embodiment of the present disclosure includes a pull-down node control circuit 10;

the pull-down node control circuit 10 is electrically connected to an input terminal I1, a reset terminal R1, a first voltage terminal V1, a second voltage terminal V2 and a pull-down node P2, respectively, and is configured to, under the control of an input signal provided by the input terminal I1 and a reset signal provided by the reset terminal R1, control the pull-down node P2 to be electrically conducted to the first voltage terminal V1 or the second voltage terminal V2, and control to hold a potential of the pull-down node P2.

In an existing shift register unit, an inverter is needed to control the potential of the pull-down node. This method requires a large number of TFTs (thin film transistors) to form an inverter; however, the inverter is affected by the threshold voltage drift of the TFT, which will lead to lower circuit reliability.

The shift register unit according to at least one embodiment of the present disclosure adopts the pull-down node control circuit 10 to control the potential of the pull-down node P2, which solves the problem of lower circuit reliability caused by that the existing shift register unit needs to use an inverter to control the potential of the pull-down node, making the structure of the shift register unit according to at least one embodiment of the present disclosure simple, reducing the number of transistors used, achieving high PPI (Pixels Per Inch, i.e., the number of pixels per inch), and obtaining higher circuit reliability.

When the shift register unit according to at least one embodiment of the present disclosure is operating, under the control of the input signal provided by the input terminal I1, the pull-down node control circuit 10 controls the pull-down node P2 to be electrically conducted to the first voltage terminal V1, and under the control of the reset signal provided by the terminal R1, the pull-down node control circuit 10 controls the pull-down node P2 to be electrically conducted to the second voltage terminal V2, and the pull-down node control circuit 10 controls to hold the potential of the pull-down node P2.

In at least one embodiment of the present disclosure, the first voltage provided by the first voltage terminal V1 may be a high voltage Vdd, and the second voltage provided by the second voltage terminal V2 may be a first low voltage LVGL1, but is not limited thereto. When the transistor which is controlled by the pull-down node P2 and is used to control the gate drive signal is a p-type transistor, the first voltage may be a low voltage, and the second voltage may be a high voltage.

In at least one embodiment of the present disclosure, the input terminal I1 may be electrically connected to a carry signal output terminal of an adjacent previous stage of shift register unit, and a reset terminal of the g-th stage of shift register unit may be electrically connected to a carry signal output terminal of the (g+2)-th stage of shift register unit, where g is a positive integer, but is not limited thereto.

When the shift register unit according to at least one embodiment of the present disclosure is operating, the display period may include an input time period, an output time period, and a reset time period that are sequentially arranged.

During the input period, under the control of the input signal provided by the input terminal I1, the pull-down node control circuit 10 controls the pull-down node P2 to be electrically conducted to the first voltage terminal V1, so as to control the potential of the pull-down node P2 to be a high voltage;

During the output period, the pull-down node control circuit 10 controls to hold the potential of the pull-down node P2 at the high voltage;

During the reset period, under the control of the reset signal provided by the reset terminal R1, the pull-down node control circuit 10 controls the pull-down node P2 to be electrically conducted to the second voltage terminal V2, so as to control the potential of the pull-down node P2 to be a low voltage.

Figure 2:
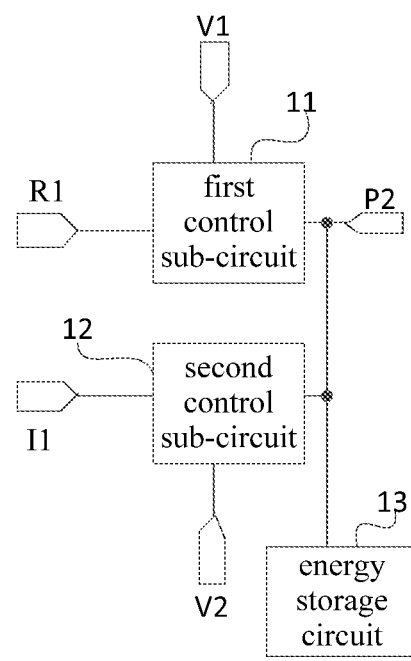
FIG. 2 is a structural diagram of a shift register unit according to at least one embodiment of the present disclosure.

As shown in FIG. 2, on the basis of the at least one embodiment shown in FIG. 1, the pull-down node control circuit 10 may include a first control sub-circuit 11, a second control sub-circuit 12, and an energy storage circuit 13;

the first control sub-circuit 11 is electrically connected to the reset terminal R1, the pull-down node P2 and the first voltage terminal V1, respectively, and is configured to, under the control of the reset signal, control the pull-down node P2 to be electrically conducted to the first voltage terminal V1;

the second control sub-circuit 12 is electrically connected to the input terminal I1, the pull-down node P2 and the second voltage terminal V2, respectively, and is configured to, under the control of the input signal, control the pull-down node P2 to be electrically conducted to the second voltage terminal V2;

the energy storage circuit 13 is electrically connected to the pull-down node P2, and is configured to hold the potential of the pull-down node P2.

When the at least one embodiment of the shift register unit shown in FIG. 2 is operating, during the input period, under the control of the input signal provided by the input terminal I1, the second control sub-circuit 12 controls the pull-down node P2 to be electrically conducted to the first voltage terminal V1;

during the output period, the energy storage circuit holds the potential of the pull-down node P2;

during the reset period, under the control of the reset signal provided by the reset terminal R1, the first control sub-circuit 11 controls the pull-down node P2 to be electrically conducted to the second voltage terminal V2.

In a specific implementation, the first control sub-circuit may include a first control transistor, the second control sub-circuit includes a second control transistor, the energy storage circuit includes a storage capacitor;

a control electrode of the first control transistor is electrically connected to the reset terminal, a first electrode of the first control transistor is electrically connected to the first voltage terminal, a second electrode of the first control transistor is electrically connected to the pull-down node;

a control electrode of the second control transistor is electrically connected to the input terminal, a first electrode of the second control transistor is electrically connected to the pull-down node, a second electrode of the second control transistor is electrically connected to the second voltage terminal;

a first terminal of the storage capacitor is electrically connected to the pull-down node, a second terminal of the storage capacitor is electrically connected to the second voltage terminal.

Figure 3:
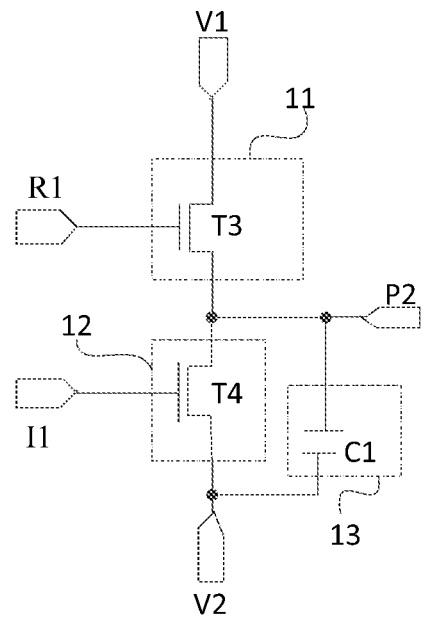
FIG. 3 is a structural diagram of a shift register unit according to at least one embodiment of the present disclosure.

As shown in FIG. 3, on the basis of the at least one embodiment shown in FIG. 2, the first control sub-circuit 11 may include a first control transistor T3, the second control sub-circuit 12 includes a second control transistor T4, the energy storage circuit 13 includes a storage capacitor C1;

the gate of the first control transistor T3 is electrically connected to the reset terminal R1, the drain of the first control transistor T3 is electrically connected to the first voltage terminal V1, the source of the first control transistor T3 is electrically connected to the pull-down node P2;

the gate of the second control transistor T4 is electrically connected to the input terminal I1, the drain of the second control transistor T4 is electrically connected to the pull-down node P2, the source of the second control transistor T4 is electrically connected to the second voltage terminal V2;

the first terminal of the storage capacitor C1 is electrically connected to the pull-down node P2, the second terminal of the storage capacitor C1 is electrically connected to the second voltage terminal V2.

In the at least one embodiment shown in FIGS. 3, T3 and T4 may be n-type thin film transistors, but not limited thereto.

When the at least one embodiment of the shift register unit shown in FIG. 3 is operating, during the input period, I1 provides a high voltage, R1 provides a low voltage, T4 is turned on and T3 is turned off, and the connection between P2 and the second voltage terminal V2 is turned on;

during the output period, both I1 and R1 provide a low voltage, T3 and T4 are turned off, and C1 holds the potential of P2;

during the reset period, I1 provides a low voltage, R1 provides a high voltage, T4 is turned off and T3 is turned on, and the connection between P2 and the first voltage terminal V1 is turned on.

Optionally, the second control sub-circuit may further include a third control transistor;

the control electrode of the second control transistor is electrically connected to the second voltage terminal via the third control transistor;

a control electrode of the third control transistor is electrically connected to the input terminal, a first electrode of the third control transistor is electrically connected to the second electrode of the second control transistor, a second electrode of the third control transistor is electrically connected to the second voltage terminal.

Preferably, the second control sub-circuit may further include a third control transistor, and the third control transistor and the second control transistor are connected in series with each other to increase the resistance on the on-off circuit between the pull-down node P2 connected in parallel with C1 and the second voltage terminal V2, so as to avoid the problem that the input signal acts on T4 for a long time and thus causes T4 to drift negatively to leak and the potential of the pull-up node cannot be held.

Preferably, the reset signal provided by the reset terminal may also be a pull-down control clock signal, so that during the reset time period and the output cut-off holding time period, the first control transistor T3 is turned on every predetermined time to continuously charge C1, which can ensure the maintenance of the potential of P2 and reduce noise.

In at least one embodiment of the present disclosure, the display period may include an input time period, an output time period, a reset time period and an output cut-off holding time period that are sequentially arranged;

during the input time period and the output time period, the potential of the pull-down control clock signal is an ineffective voltage, so that the first control sub-circuit 11 controls, under the control of the reset signal, the pull-down node P2 to be disconnected from the first voltage terminal V1;

during the reset time period, the potential of the pull-down control clock signal is a first effective voltage, so that the first control sub-circuit 11 controls, under the control of the reset signal, the pull-down node P2 to be electrically conducted to the first voltage terminal V1;

the output cut-off holding time period includes a plurality of output cut-off holding phases arranged in sequence;

the output cut-off holding phases includes a first sub-phase and a second sub-phase arranged in sequence;

during the first sub-phase, the potential of the pull-down control clock signal is an ineffective voltage, so that the first control sub-circuit 11 controls, under the control of the reset signal, the pull-down node P2 to be disconnected from the first voltage terminal V1;

during the second sub-phase, the potential of the pull-down control clock signal is a first effective voltage, so that the first control sub-circuit 11 controls, under the control of the reset signal, the pull-down node P2 to be electrically conducted to the first voltage terminal V1.

In this embodiment, when the transistor included in the first control sub-circuit 11 is an n-type transistor, the ineffective voltage is a low voltage, and the first effective voltage is a high voltage; when the transistor included in the first control sub-circuit 11 is a p-type transistor, the ineffective voltage is a high voltage, and the first effective voltage is a low voltage; however, this is not limited.

In a specific implementation, the shift register unit may further include a setting circuit, a pull-up node potential holding circuit, and N pull-up nodes;

the setting circuit includes N setting sub-circuits connected in series with each other, wherein N is an integer greater than or equal to 2; the pull-up node potential holding circuit includes N potential holding sub-circuits;

a control terminal of a first setting sub-circuit is electrically connected to the input terminal, a first terminal of the first setting sub-circuit is electrically connected to the first voltage terminal, a second terminal of the first setting sub-circuit is electrically connected to a first pull-up node, the first setting sub-circuit is configured to, under the control of the input signal, control the first pull-up node to be electrically conducted to the first voltage terminal;

a control terminal of an n-th setting sub-circuit is electrically connected to the input terminal, a first terminal of the n-th setting sub-circuit is electrically connected to an (n−1)-th pull-up node, a second terminal of the n-th setting sub-circuit is electrically connected to an n-th pull-up node; the n-th setting sub-circuit is configured to, under the control of the input signal, control the (n−1)-th pull-up node to be electrically conducted to the n-th pull-up node; n is an integer greater than 1 and less than or equal to N;

a first potential holding sub-circuit is electrically connected to the first pull-up node, and is configured to hold a potential of the first pull-up node;

an n-th potential holding sub-circuit is electrically connected to the n-th pull-up node, and is configured to hold a potential of the n-th pull-up node.

In the related art, when an existing gate drive circuit including multiple stages of shift register units drives at least two rows of pixel circuits simultaneously, a pull-up node is used to control the output of at least two stages of gate drive signals, and the falling times tf of the gate drive signals provided by the existing gate drive circuit to the at least two rows of pixel circuits are quite different. However, in the related art, at least two pull-up nodes separately formed in the shift register unit requires additional signals to act on the gate of the transistor for a long time, or requires a TFT to form a diode structure. The former is not conducive to reliability, and the latter will lose the voltage of the pull-up node after separation. At least one embodiment of the present disclosure can avoid the above problem by including multiple stages of setting sub-circuits connected in series with each other in the setting circuit.

At least one embodiment of the present disclosure adopts a setting circuit formed by multiple stages of setting sub-circuits connected in series with each other. The multiple stages of setting sub-circuits connected in series with each other provide the potentials of the pull-up nodes, respectively, and each of the pull-up nodes controls the output of the gate drive signal of the corresponding stage, so as to reduce the difference in falling time tf of all stages of gate drive signals output by the shift register unit.

Next, the shift register unit according to at least one embodiment of the present disclosure is described by taking the example that N is equal to 2, but in practical operations, N may also be greater than 2.

Figure 4:
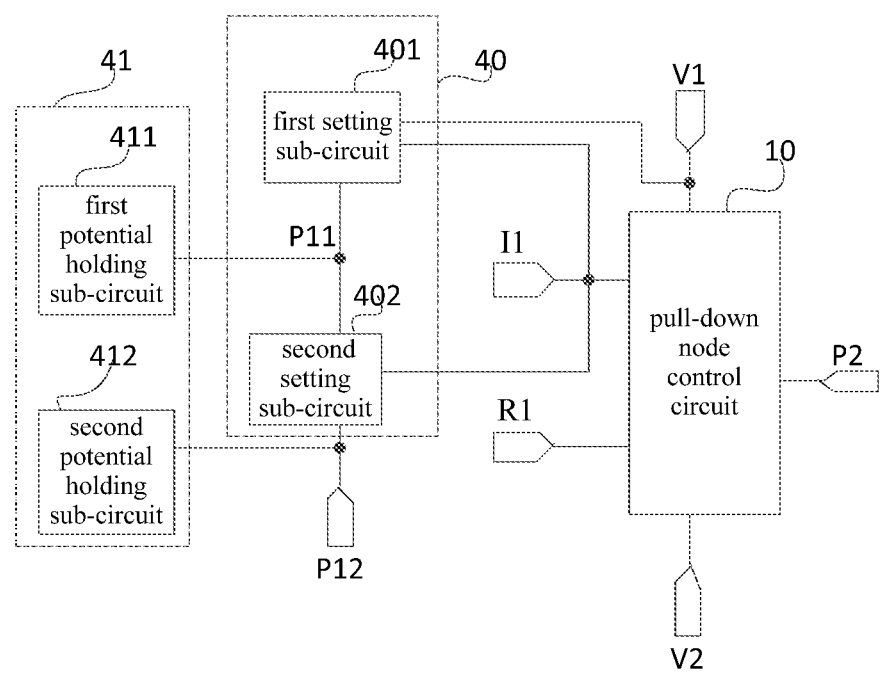
FIG. 4 is a structural diagram of a shift register unit according to at least one embodiment of the present disclosure.

As shown in FIG. 4, on the basis of the shift register unit shown in FIG. 1, the shift register unit may further include a setting circuit 40, a pull-up node potential holding circuit 41, a first pull-up node P11 and a second pull-up node P12;
  the setting circuit 40 includes a first setting sub-circuit 401 and a second setting sub-circuit 402 connected in series with each other;
  the pull-up node potential holding circuit 41 includes a first potential holding sub-circuit 411 and a second potential holding sub-circuit 412;
  a control terminal of a first setting sub-circuit 401 is electrically connected to the input terminal I1, a first terminal of the first setting sub-circuit 401 is electrically connected to the first voltage terminal V1, a second terminal of the first setting sub-circuit 401 is electrically connected to the first pull-up node P11, the first setting sub-circuit 401 is configured to, under the control of the input signal, control the first pull-up node P11 to be electrically conducted to the first voltage terminal V1;
  a control terminal of a second setting sub-circuit 402 is electrically connected to the input terminal I1, a first terminal of the second setting sub-circuit 402 is electrically connected to the first pull-up node P11, a second terminal of the second setting sub-circuit 402 is electrically connected to the second pull-up node P12; the second setting sub-circuit 402 is configured to, under the control of the input signal, control the first pull-up node P11 to be electrically conducted to the second pull-up node P12;
  the first potential holding sub-circuit 411 is electrically connected to the first pull-up node P11, and is configured to hold the potential of the first pull-up node P11;
  the second potential holding sub-circuit 412 is electrically connected to the second pull-up node P12, and is configured to hold the potential of the second pull-up node P12.

In the at least one embodiment of the shift register unit of the present disclosure shown in FIG. 4, the setting circuit 40 includes the first setting sub-circuit 401 and the second setting sub-circuit 402 connected in series with each other, control separately the potential of the first pull-up node P11 and the potential of the second pull-up node P12, the first potential holding sub-circuit 411 holds the potential of the first pull-up node P11, and the second potential holding sub-circuit 412 holds the potential of the second pull-up node P12. At least one embodiment of the present disclosure provides a shift register unit with a multi-stage output function, which can be used for narrow bezel displays (because the one-stage shift register unit can output multiple stages of gate drive signals to control the scanning of multiple rows of pixel drive circuits, the number of stages of the shift register units included in the gate drive circuit is reduced, and is particularly suitable for large-size OLED (organic light-emitting diode) displays, and through the serial structure of the setting sub-circuit, mutual interference between multiple stages of gate drive signals output by the one-stage shift register unit is avoided.

Optionally, the first setting sub-circuit may include a first setting transistor; the n-th setting sub-circuit may include an n-th setting transistor;
  a control electrode of the first setting transistor is electrically connected to the input terminal, a first electrode of the first setting transistor is electrically connected to the first voltage terminal, a second electrode of the first setting transistor is electrically connected to the first pull-up node;
  a control electrode of the n-th setting transistor is electrically connected to the input terminal, a first electrode of the n-th setting transistor is electrically connected to the (n−1)-th pull-up node, a second electrode of the n-th setting transistor is electrically connected to the n-th pull-up node.

Figure 5:
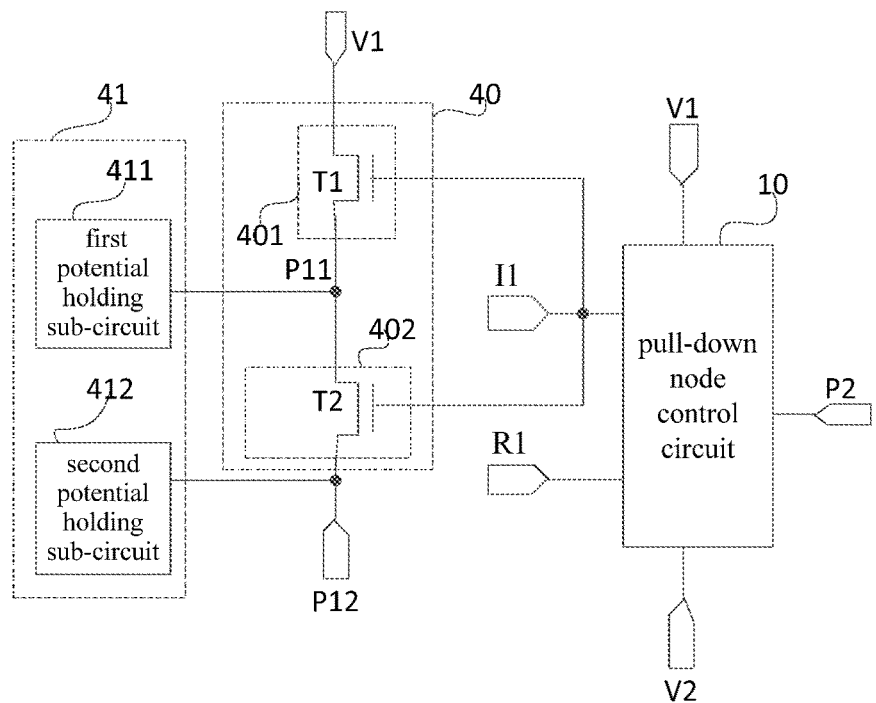
FIG. 5 is a structural diagram of a shift register unit according to at least one embodiment of the present disclosure.

As shown in FIG. 5, on the basis of the at least one embodiment of the shift register unit shown in FIG. 4, the first setting sub-circuit 401 may include a first setting transistor T1, and the second setting sub-circuit 401 may include a second setting transistor T2;
  the gate of T1 is electrically connected to the input terminal I1, the drain of T1 is electrically connected to the first voltage terminal V1, the source of T1 is electrically connected to the first pull-up node P11;
  the gate of T2 is electrically connected to the input terminal I1, the drain of T2 is electrically connected to the first pull-up node P11, the source of T2 is electrically connected to the second pull-up node P12.

In at least one embodiment shown in FIG. 5, both T1 and T2 are n-type thin film transistors, but not limited thereto.

In a specific implementation, the shift register unit may further include N gate drive signal output terminals;
  the first potential holding sub-circuit includes a first energy storage capacitor, the n-th potential holding sub-circuit includes an n-th energy storage capacitor;
  a first terminal of the first energy storage capacitor is electrically connected to the first pull-up node, a second terminal of the first energy storage capacitor is electrically connected to a first gate drive signal output terminal;
  a first terminal of the n-th energy storage capacitor is electrically connected to the n-th pull-up node, a second terminal of the n-th energy storage capacitor is electrically connected to an n-th gate drive signal output terminal.

When the shift register unit according to at least one embodiment of the present disclosure is operating, during at least part of the time included in the output time period, the first energy storage capacitor bootstraps to raise the potential of the first pull-up node, and the second energy storage capacitor bootstraps to raise the potential of the second pull-up node.

In at least one embodiment of the present disclosure, the shift register unit may further includes a pull-down circuit;

the pull-down circuit is electrically connected to the pull-down node, the N pull-up nodes and the second voltage terminal, respectively, and is configured to, under the control of the potential of the pull-down node, control the N pull-up nodes to be electrically conducted to the second voltage terminal, respectively.

The pull-down circuit is configured to control the potentials of the N pull-up nodes to be reset, under the control of the potential of the pull-down node.

Preferably, the shift register unit may include a feedback circuit and a pull-down circuit;

the pull-down circuit is electrically connected to the pull-down node, the N pull-up nodes and a feedback node, respectively, and is configured to, under the control of the potential of the pull-down node, control the N pull-up nodes to be electrically conducted to the feedback node, respectively;

the feedback circuit is electrically connected to the first pull-up node, the feedback node, the first voltage terminal and second voltage terminal, respectively, and is configured to, under the control of the potential of the first pull-up node, control the feedback node to be electrically conducted to the first voltage terminal, and under the control of the potential of the pull-down node, control the feedback node to be electrically conducted to the second voltage terminal.

Preferably, the shift register unit may include the feedback circuit and the pull-down circuit, the feedback circuit is configured to control the feedback node to be electrically conducted to the first voltage terminal under the control of the potential of the first pull-up node, and control the feedback node to be electrically conducted to the second voltage terminal under the control of the potential of the pull-down node; when the potential of the first pull-up node is the second effective voltage, the feedback node is connected to the first voltage terminal. Even if the transistor directly electrically connected to the respective pull-up node generates leakage, it will not affect the potential of the pull-up node.

In a specific implementation, when the transistor included in the feedback circuit, in which its gate is electrically connected to the first pull-up node, is an n-type transistor, the second effective voltage is a high voltage, and when the transistor included in the feedback circuit, in which its gate is electrically connected to the first pull-up node, is a p-type transistor, the second effective voltage is a low voltage.

Figure 6:
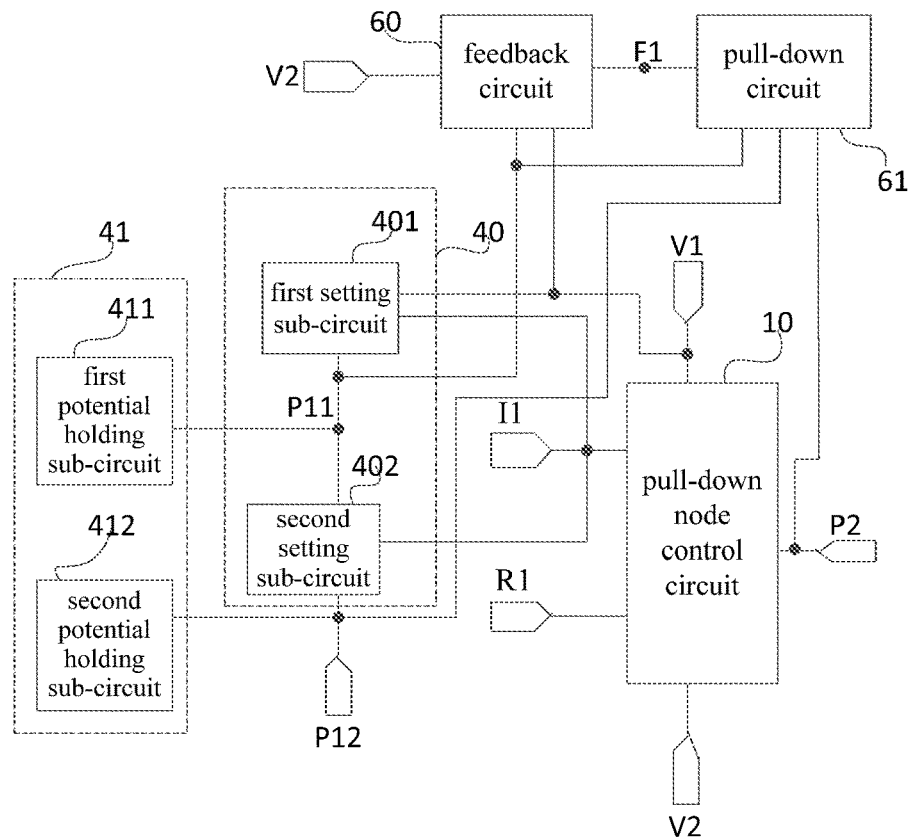
FIG. 6 is a structural diagram of a shift register unit according to at least one embodiment of the present disclosure.

As shown in FIG. 6, on the basis of the at least one embodiment of the shift register unit shown in FIG. 4, the shift register unit according to at least one embodiment of the present disclosure further include a feedback circuit 60 and a pull-down circuit 61;

the pull-down circuit 61 is electrically connected to the pull-down node P2, the first pull-up node P11, the second pull-up node P12, and a feedback node F1, respectively, and is configured to, under the control of the potential of the pull-down node P2, control the first pull-up node P11 to be electrically conducted to the feedback node F1, and control the second pull-up node P12 to be electrically conducted to the feedback node F1;

the feedback circuit 60 is electrically connected to the first pull-up node P11, the feedback node F1, the first voltage terminal V1 and the second voltage terminal V2, respectively, and is configured to, under the control of the potential of the first pull-up node P11, control the feedback node F1 to be electrically conducted to the first voltage terminal V1, and under the control of the potential of the pull-down node P2, control the feedback node F1 to be electrically conducted to the second voltage terminal V2.

The feedback circuit 60 is added in the at least one embodiment of the shift register unit of the present disclosure as shown in FIG. 6, so that even if the transistor directly electrically connected to the respective pull-up node generates leakage, it will not affect the potential of the pull-up node.

When the at least one embodiment of the shift register unit of the present disclosure shown in FIG. 6 is operating, in the case that the potential of the first pull-up node P11 is a third effective voltage, the feedback circuit 60 controls the feedback node F1 to be electrically conducted to the first voltage terminal V1 under the control of the potential of the first pull-up node P11, so that even if the transistor included in the pull-down circuit leaks, the potential of each pull-up node will not drop, and the corresponding transistor with its gate being electrically connected to the pull-up node will not fail to be turned on properly.

In at least one embodiment of the present disclosure, when the transistor included in the feedback circuit 60, in which its gate is electrically connected to the first pull-up node P11, is an n-type transistor, the third effective voltage is a high voltage, and when the transistor included in the feedback circuit 60, in which its gate is electrically connected to the first pull-up node P11, is a p-type transistor, the third effective voltage is a low voltage.

Optionally, the feedback circuit may include a first feedback transistor and a second feedback transistor;

a control electrode of the first feedback transistor is electrically connected to the first pull-up node, a first electrode of the first feedback transistor is electrically connected to the first voltage terminal, a second electrode of the first feedback transistor is electrically connected to the feedback node;

a control electrode of the second feedback transistor is electrically connected to the pull-down node, a first electrode of the second feedback transistor is electrically connected to the feedback node, a second electrode of the second feedback transistor is electrically connected to the second voltage terminal.

Figure 7:
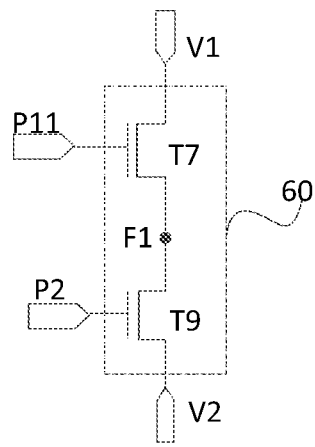
FIG. 7 is a circuit diagram of at least one embodiment of a feedback circuit in a shift register unit according to an embodiment of the present disclosure.

As shown in FIG. 7, the feedback circuit may include a first feedback transistor T7 and a second feedback transistor T9;

the gate of the first feedback transistor T7 is electrically connected to the first pull-up node P11, the drain of the first feedback transistor T7 is electrically connected to the first voltage terminal V1, the source of the first feedback transistor is electrically connected to the feedback node F1;

the gate of the second feedback transistor T9 is electrically connected to the pull-down node P2, the drain of the second feedback transistor T9 is electrically connected to the feedback node F1, the source of the second feedback transistor T9 is electrically connected to the second voltage terminal V2.

In the at least one embodiment shown in FIG. 7, both T7 and T9 are n-type thin film transistors, but not limited thereto.

When the at least one embodiment of the shift register unit of the present disclosure shown in FIG. 7 is operating, when the potential of P11 is a high voltage, T7 is turned on to control F1 to be electrically conducted to V1;

when the potential of P11 is a low voltage, T7 is turned off;

when the potential of P2 is a high voltage, T9 is turned on to control F1 to be electrically conducted to V2;

when the potential of P2 is a low voltage, T9 is turned off.

In a specific implementation, the shift register unit may further includes a drive output circuit and N gate drive signal output terminals; the drive output circuit may include N drive output sub-circuits;

a first drive output sub-circuit is electrically connected to a first gate drive signal output terminal, the first pull-up node, the pull-down node, a first output clock signal terminal and a third voltage terminal, respectively, and is configured to, under the control of the potential of the first pull-up node, control the first gate drive signal output terminal to be electrically conducted to the first output clock signal terminal, and under the control of the potential of the pull-down node, control the first gate drive signal output terminal to be electrically conducted to the third voltage terminal;

an n-th drive output sub-circuit is electrically connected to an n-th gate drive signal output terminal, the n-th pull-up node, the pull-down node, an n-th output clock signal terminal and the third voltage terminal, respectively, and is configured to, under the control of the potential of the n-th pull-up node, control the n-th gate drive signal output terminal to be electrically conducted to the n-th output clock signal terminal, and under the control of the potential of the pull-down node, control the n-th gate drive signal output terminal to be electrically conducted to the third voltage terminal.

The shift register unit according to at least one embodiment of the present disclosure may further include N drive output sub-circuits, the first drive output sub-circuit controls the first gate drive signal output terminal to output a first gate drive signal, under the control of the potential of the first pull-up node and the potential of the pull-down node, and the n-th drive output sub-circuit controls the n-th gate drive signal output terminal to output an n-th gate drive signal, under the control of the potential of the n-th pull-up node and the potential of the pull-down node.

In at least one embodiment of the present disclosure, the shift register unit may further include a carry signal output terminal and a carry signal output circuit;

the carry signal output circuit is electrically connected to the first pull-up node, the pull-down node, a carry output clock signal terminal, the carry signal output terminal and the second voltage terminal, respectively, and is configured to, under the control of the potential of the first pull-up node, control the carry signal output terminal to be electrically conducted to the carry output clock signal terminal, and under the control of the potential of the pull-down node, control the carry signal output terminal to be electrically conducted to the second voltage terminal.

The shift register unit according to at least one embodiment of the present disclosure may further include a carry signal output circuit which control the carry signal output terminal to output the carry signal under the control of the potential of the first pull-up node and the potential of the pull-down node, and the carry signal is used to provide an input signal for the adjacent next stage of shift register unit.

Figure 8:
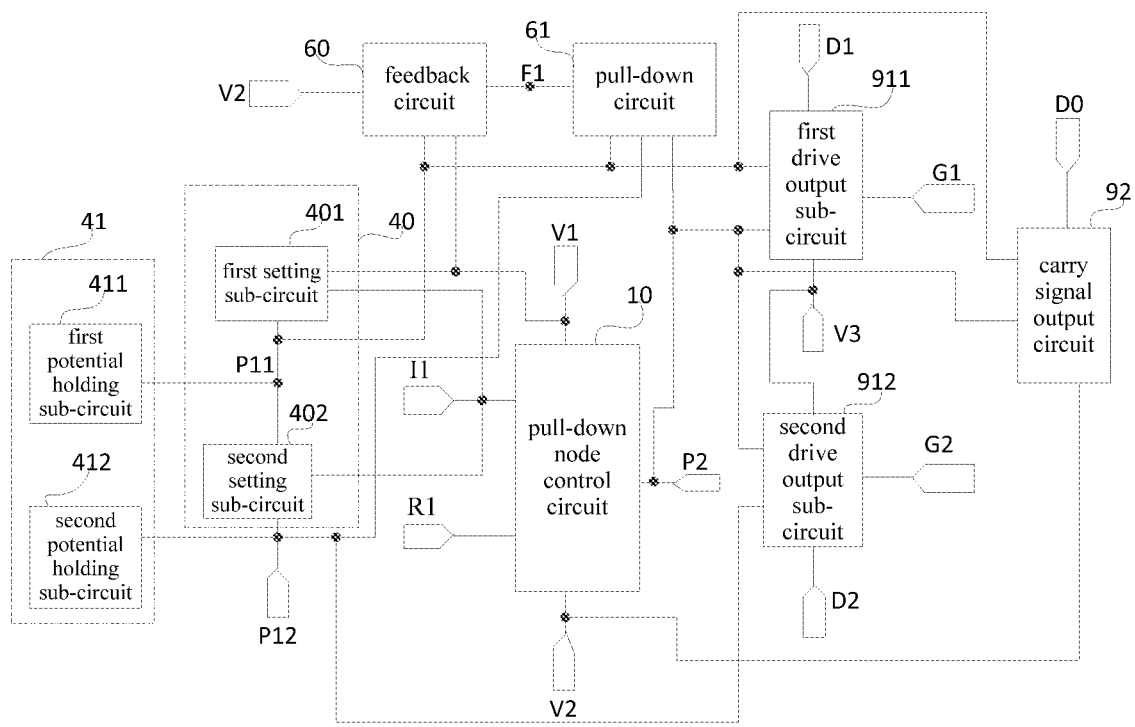
FIG. 8 is a structural diagram of a shift register unit according to at least one embodiment of the present disclosure.

As shown in FIG. 8, on the basis of the at least one embodiment of the shift register unit shown in FIG. 6, the shift register unit according to at least one embodiment of the present disclosure further includes a drive output circuit, a first gate drive signal output terminal G1, a second gate drive signal output terminal G2, a carry output circuit 92 and a carry signal output terminal J1;

the drive output circuit may include a first drive output sub-circuit 911 and a second drive output sub-circuit 912;

the first drive output sub-circuit 911 is electrically connected to the first gate drive signal output terminal G1, the first pull-up node P11, the pull-down node P2, a first output clock signal terminal D1 and a third voltage terminal V3, respectively, and is configured to, under the control of the potential of the first pull-up node P11, control the first gate drive signal output terminal G1 to be electrically conducted to the first output clock signal terminal D1, and under the control of the potential of the pull-down node P2, control the first gate drive signal output terminal G1 to be electrically conducted to the third voltage terminal V3;

the second drive output sub-circuit 912 is electrically connected to the second gate drive signal output terminal G2, the second pull-up node P12, the pull-down node P2, an second output clock signal terminal D2 and the third voltage terminal V3, respectively, and is configured to, under the control of the potential of the second pull-up node P12, control the second gate drive signal output terminal G2 to be electrically conducted to the second output clock signal terminal D2, and under the control of the potential of the pull-down node P2, control the second gate drive signal output terminal G2 to be electrically conducted to the third voltage terminal V3.

the carry signal output circuit 92 is electrically connected to the first pull-up node P11, the pull-down node P2, a carry output clock signal terminal D0, the carry signal output terminal J1 and the second voltage terminal V2, respectively, and is configured to, under the control of the potential of the first pull-up node P11, control the carry signal output terminal J1 to be electrically conducted to the carry output clock signal terminal D0, and under the control of the potential of the pull-down node P2, control the carry signal output terminal J1 to be electrically conducted to the second voltage terminal V2.

In at least one embodiment of the present disclosure, the third voltage terminal may be used to provide a second low voltage VGL, but it is not limited thereto.

Next, descriptions are made through shift register units according to two specific embodiments.

Figure 9:
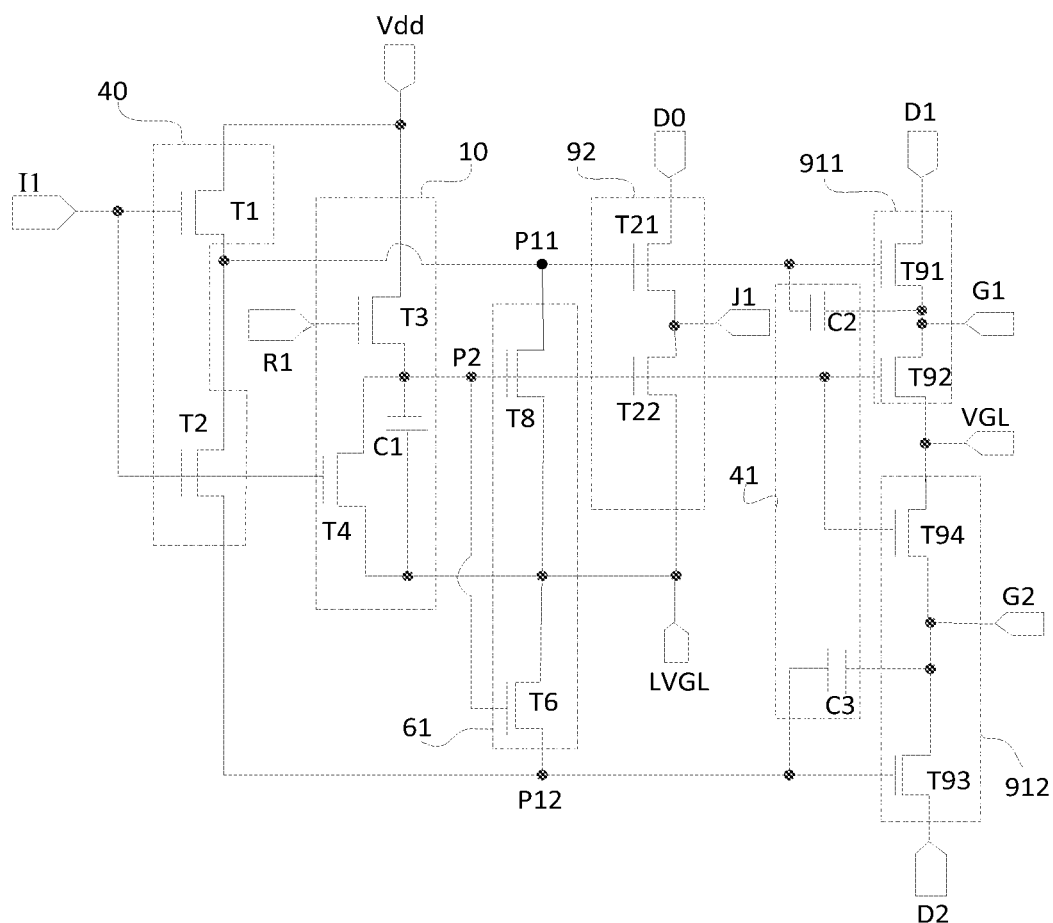
FIG. 9 is a circuit diagram of a first specific embodiment of the shift register unit according to the present disclosure.

As shown in FIG. 9, a first specific embodiment of the shift register unit according to the present disclosure includes the pull-down node control circuit 10, the setting circuit 40, the pull-up node potential holding circuit 41, the pull-down circuit 61, the drive output circuit, the first gate drive signal output terminal G1, the second gate drive signal output terminal G2, the carry output circuit 92 and the carry signal output terminal J1;

the pull-down node control circuit 10 includes a first control sub-circuit, the second control sub-circuit and an energy storage circuit;

the first control sub-circuit includes a first control transistor T3, the second control circuit includes a second control transistor T4, and the energy storage circuit includes a storage capacitor C1;

the gate of the first control transistor T3 is electrically connected to the reset terminal R1, the drain of the first control transistor T3 is connected to the high voltage Vdd, the source of the first control transistor T3 is electrically connected to the pull-down node P2;

the gate of the second control transistor T4 is electrically connected to the input terminal I1, the drain of the second control transistor T4 is electrically connected to the pull-down node P2, the source of the second control transistor T4 is electrically connected to the first low voltage LVGL;

the first terminal of the storage capacitor C1 is electrically connected to the pull-down node P2, the second terminal of the storage capacitor C1 is connected to the first low voltage LVGL;

the setting circuit 40 includes a first setting sub-circuit and a second setting sub-circuit connected in series with each other;

the pull-up node potential holding circuit 41 includes a first potential holding sub-circuit and a second potential holding sub-circuit;

the first setting sub-circuit includes the first setting transistor T1, the second setting sub-circuit includes the second setting transistor T2;

the gate of T1 is electrically connected to the input terminal I1, the drain of T1 is electrically connected to the first voltage terminal V1, the source of T1 is electrically connected to the first pull-up node P11;

the gate of T2 is electrically connected to the input terminal I1, the drain of T2 is electrically connected to the first pull-up node P11, the source of T2 is electrically connected to the second pull-up node P12;

the first potential holding sub-circuit includes a first energy storage capacitor C2, the second potential holding sub-circuit includes a second energy storage capacitor C3;

the first terminal of the first energy storage capacitor C2 is electrically connected to the first pull-up node P11, the second terminal of the first energy storage capacitor C2 is electrically connected to the first gate drive signal output terminal G1;

the first terminal of the second energy storage capacitor C3 is electrically connected to the second pull-up node P12, the second terminal of the second energy storage capacitor C3 is electrically connected to the second gate drive signal output terminal G2;

the pull-down circuit 61 includes a first pull-down transistor T8 and a second pull-down transistor T6;

the gate of T8 is electrically connected to the pull-down node P2, the drain of T8 is electrically connected to the first pull-up node P11, the source of T8 is connected to the first low voltage LVGL;

the gate of T6 is electrically connected to the pull-down node P2, the drain of T6 is electrically connected to the second pull-up node P12, the source of T6 is connected to the first low voltage LVGL;

the drive output circuit includes a first drive output sub-circuit 911 and a second drive output sub-circuit 912;

the first drive output sub-circuit 911 includes a first drive output transistor T91 and a second drive output transistor T92;

the gate of T91 is electrically connected to the first pull-up node P11, the drain of T91 is electrically connected to the first output clock signal terminal D1, the source of T91 is electrically connected to the first gate drive signal output terminal G1;

the gate of T92 is electrically connected to the pull-down node P2, the drain of T92 is electrically connected to the first gate drive signal output terminal G1, the source of T92 is connected to the second low voltage VGL;

the second drive output sub-circuit 912 includes a third drive output transistor T93 and a fourth drive output transistor T94;

the gate of T93 is electrically connected to the second pull-up node P12, the drain of T93 is electrically connected to the second output clock signal terminal D2, the source of T93 is electrically connected to the second gate drive signal output terminal G2;

the gate of T94 is electrically connected to the pull-down node P2, the drain of T94 is electrically connected to the second gate drive signal output terminal G2, the source of T94 is connected to the second low voltage VGL;

the carry signal output circuit 92 includes a first carry signal output transistor T21 and a second carry signal output transistor T22;

the gate of T21 is electrically connected to the first pull-up node P11, the drain of T21 is electrically connected to the carry output clock signal terminal D0, the source of T21 is electrically connected to the carry signal output terminal J1;

the gate of T22 is electrically connected to the pull-down node P2, the drain of T22 is electrically connected to the carry signal output terminal J1, the source of T22 is connected to the first low voltage LVGL.

In the first specific embodiment of the shift register unit shown in FIG. 9, all the transistors are n-type thin film transistors, but not limited thereto.

In the first specific embodiment of the shift register unit shown in FIG. 9, the output terminal I1 is electrically connected to the carry signal output terminal of the adjacent previous stage of shift register unit.

In the first specific embodiment of the shift register unit shown in FIG. 9, the first voltage terminal is a voltage terminal providing the high voltage Vdd, the second voltage terminal is a voltage terminal providing the first low voltage LVGL, the third voltage terminal is a voltage terminal providing the second low voltage VGL.

Figure 10:
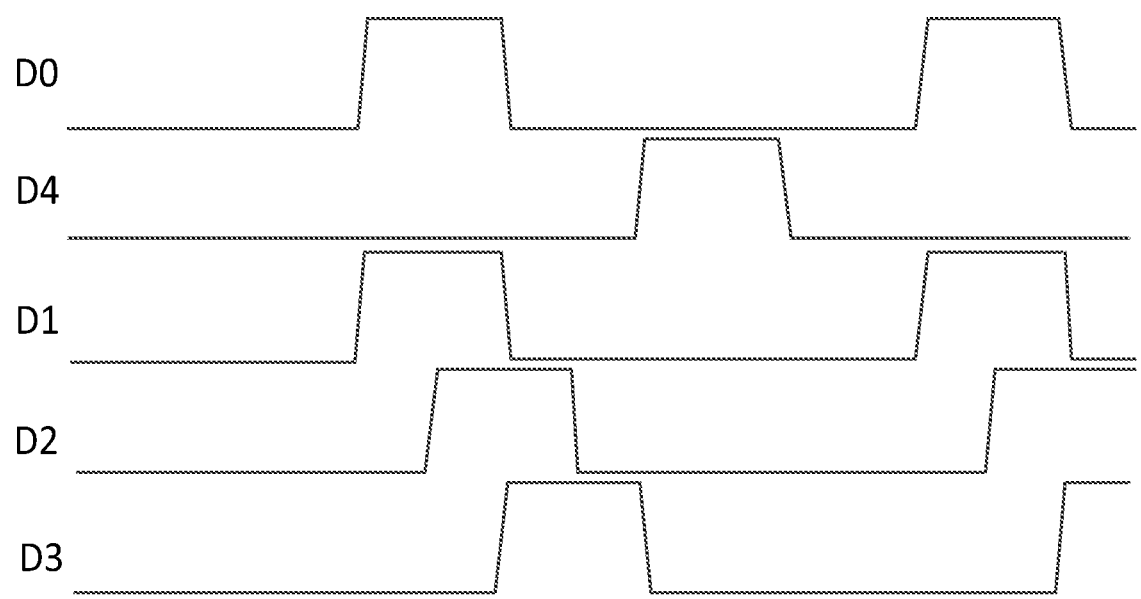
FIG. 10 is a waveform diagram of clock signals used in a specific embodiment of the shift register unit according to the present disclosure.

As shown in FIG. 10, the period of the first output clock signal provided by D1 is equal to the period T of the second output clock signal provided by D2, the second output clock signal is delayed by T/8 from the first output clock signal, the duty ratio of the first output clock signal is equal to that of the second output clock signal, and the duty ratio of the first output clock signal may be 1/4, but is not limited thereto.

In FIG. 10, a third output clock signal labeled D3 provided by a third output clock signal terminal is shown, the third output clock signal is delayed by T/2 from the second output clock signal, the period of the third output clock signal is equal to that of the first output clock signal, and the duty ratio of the third output clock signal may be equal to that of the first output clock signal.

As shown in FIG. 10, the carry output clock signal provided by D0 may be the same as the first output clock signal, but is not limited to this.

Figure 11:
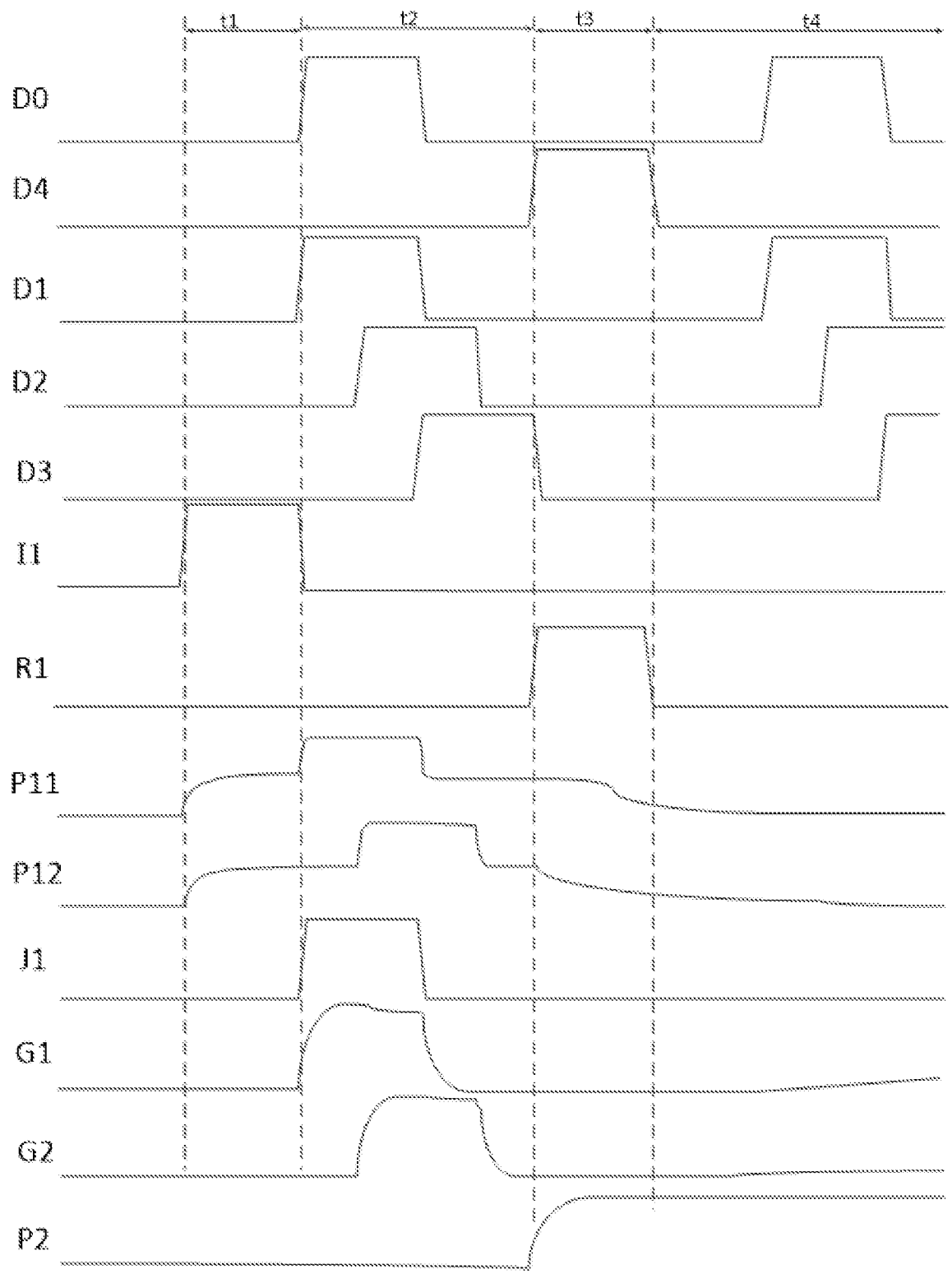
FIG. 11 is a working timing diagram of the first specific embodiment of the shift register unit according to the present disclosure.

As shown in FIG. 11, when the first specific embodiment of the shift register unit according to the present disclosure shown in FIG. 9 is operating, the display period includes an input time period t1, an output time period t2, a reset time period t3 and an output cut-off holding time period t4 that are sequentially arranged;

during the input time period t1, I1 provides the high voltage, R1 provides the low voltage, T1 and T2 are turned on, the potential of P11 and the potential of P12 are pulled up; T3 is turned off; T4 is turned on to control P2 to be connected to LVGL;

during the output time period t2, both I1 and R1 provide the low voltage, T1, T2, T3, and T4 are all turned off; the potential of the first output clock signal provided by D1 and the potential of the second output clock signal provided by D2 rise to the high voltage sequentially. After the potential of the first output clock signal rises to the high voltage and a predetermined time T elapses, the potential of the first output clock signal drops to the low voltage; after the potential of the second output clock signal rises to the high voltage and a predetermined time T elapses, the potential of the second output clock signal drops to the low voltage; when the potential of the first output clock signal rises from the low voltage to the high voltage, the first output clock signal raises the potential of P11 through the bootstrap of C2, and when the potential of the first output clock signal drops from the high voltage to the low voltage, C2 correspondingly controls to pull down the potential of P11; when the potential of the second output clock signal rises from the low voltage to the high voltage, the second output clock signal raises P12 through the bootstrap of C3, and when the potential of the second output clock signal drops from the high voltage to the low voltage, C3 correspondingly controls to pull down the potential of P12;

during the input phase t1 and the output phase t2, T91, T93, and T21 are all turned on, so that G1 is electrically connected to the first output clock signal terminal D1, G2 is electrically connected to the second output clock signal terminal D2, and J1 is electrically connected to the carry output clock signal terminal D0;

during the reset time period t3, R1 provides the high voltage, I1 provides the low voltage, T1 and T2 are turned off, T3 is turned on, P2 is connected to the high voltage Vdd, T8 and T6 are turned on to control both P11 and P12 to be connected to LVGL and control T91, T93 and T21 to be all turned off, and T92, T94 and T22 are all turned on, both G1 and G2 output the second low voltage VGL, and J1 outputs the first low voltage LVGL;

during the output cut-off holding time period t4, both R1 and I1 provide the low voltage, T1, T2, T3 and T4 are all turned off, C1 holds the potential of P2 at the high voltage, T92, T94 and T22 are all turned on, both G1 and G2 outputs the second low voltage, and J1 outputs the first low voltage LVGL.

It can be seen from FIG. 11 that the falling time of the first gate drive signal output at G1 is not much different from the falling time of the second gate drive signal output at G2.

In FIGS. 10 and 11, the horizontal axis is time and the vertical axis is potential.

Figure 12:
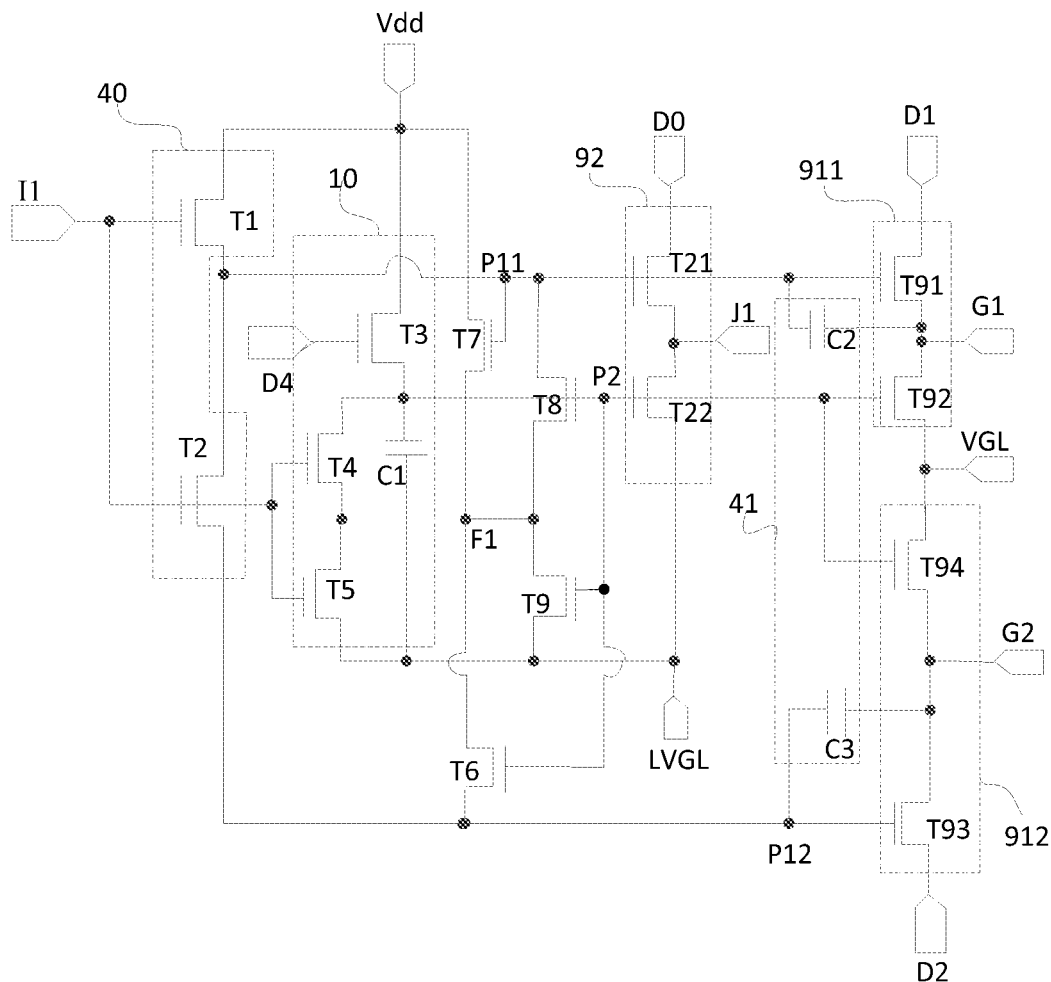
FIG. 12 is a circuit diagram of a second specific embodiment of the shift register unit according to the present disclosure.

As shown in FIG. 12, a second specific embodiment of the shift register unit according to the present disclosure includes the pull-down node control circuit 10, the setting circuit 40, the pull-up node potential holding circuit 41, the feedback circuit, the pull-down circuit, the drive output circuit, the first gate drive signal output terminal G1, the second gate drive signal output terminal G2, the carry output circuit 92 and the carry signal output terminal J1;

the pull-down node control circuit 10 includes a first control sub-circuit, the second control sub-circuit and the energy storage circuit;

the first control sub-circuit includes the first control transistor T3, the second control circuit includes the second control transistor T4 and the third control transistor T5, and the energy storage circuit includes a storage capacitor C1;

the gate of the first control transistor T3 is electrically connected to the pull-down control clock signal terminal D4, the drain of the first control transistor T3 is connected to the high voltage Vdd, the source of the first control transistor T3 is electrically connected to the pull-down node P2;

the gate of the second control transistor T4 is electrically connected to the input terminal I1, the drain of the second control transistor T4 is electrically connected to the pull-down node P2;

the gate of the third control transistor T5 is electrically connected to the input terminal I1, the drain of the third control transistor T5 is electrically connected to the source of the second control transistor T4, the source of the third control transistor T5 is connected to the first low voltage LVGL;

the first terminal of the storage capacitor C1 is electrically connected to the pull-down node P2, the second terminal of the storage capacitor C1 is connected to the first low voltage LVGL;

the setting circuit 40 includes a first setting sub-circuit and a second setting sub-circuit connected in series with each other;

the pull-up node potential holding circuit 41 includes a first potential holding sub-circuit and a second potential holding sub-circuit;

the first setting sub-circuit includes the first setting transistor T1, the second setting sub-circuit includes the second setting transistor T2;

the gate of T1 is electrically connected to the input terminal I1, the drain of T1 is electrically connected to the first voltage terminal V1, the source of T1 is electrically connected to the first pull-up node P11;

the gate of T2 is electrically connected to the input terminal I1, the drain of T2 is electrically connected to the first pull-up node P11, the source of T2 is electrically connected to the second pull-up node P12;

the first potential holding sub-circuit includes a first energy storage capacitor C2, the second potential holding sub-circuit includes a second energy storage capacitor C3;

the first terminal of the first energy storage capacitor C2 is electrically connected to the first pull-up node P11, the second terminal of the first energy storage capacitor C2 is electrically connected to the first gate drive signal output terminal G1;

the first terminal of the second energy storage capacitor C3 is electrically connected to the second pull-up node P12, the second terminal of the second energy storage capacitor C3 is electrically connected to the second gate drive signal output terminal G2;

the pull-down circuit includes the first pull-down transistor T8 and a second pull-down transistor T6;

the gate of T8 is electrically connected to the pull-down node P2, the drain of T8 is electrically connected to the first pull-up node P11, the source of T8 is connected to the feedback node F1;

the gate of T6 is electrically connected to the pull-down node P2, the drain of T6 is electrically connected to the second pull-up node P12, the source of T6 is connected to the feedback node F1;

the feedback circuit includes the first feedback transistor T7 and the second feedback transistor T9;

the gate of the first feedback transistor T7 is electrically connected to the first pull-up node P11, the drain of the first feedback transistor T7 is electrically connected to the high voltage Vdd, the source of the first feedback transistor T7 is electrically connected to the feedback node F1;

the gate of the second feedback transistor T9 is electrically connected to the pull-down node P2, the drain of the second feedback transistor T9 is electrically connected to the feedback node F1, the source of the second feedback transistor T9 is electrically connected to the first low voltage LVGL;

the drive output circuit includes the first drive output sub-circuit 911 and the second drive output sub-circuit 912;

the first drive output sub-circuit 911 includes the first drive output transistor T91 and the second drive output transistor T92;

the gate of T91 is electrically connected to the first pull-up node P11, the drain of T91 is electrically connected to the first output clock signal terminal D1, the source of T91 is electrically connected to the first gate drive signal output terminal G1;

the gate of T92 is electrically connected to the pull-down node P2, the drain of T92 is electrically connected to the first gate drive signal output terminal G1, the source of T92 is connected to the second low voltage VGL;

the second drive output sub-circuit 912 includes the third drive output transistor T93 and the fourth drive output transistor T94;

the gate of T93 is electrically connected to the second pull-up node P12, the drain of T93 is electrically connected to the second output clock signal terminal D2, the source of T93 is electrically connected to the second gate drive signal output terminal G2;

the gate of T94 is electrically connected to the pull-down node P2, the drain of T94 is electrically connected to the second gate drive signal output terminal G2, the source of T94 is connected to the second low voltage VGL;

the carry signal output circuit 92 includes the first carry signal output transistor T21 and the second carry signal output transistor T22;

the gate of T21 is electrically connected to the first pull-up node P11, the drain of T21 is electrically connected to the carry output clock signal terminal D0, the source of T21 is electrically connected to the carry signal output terminal J1;

the gate of T22 is electrically connected to the pull-down node P2, the drain of T22 is electrically connected to the carry signal output terminal J1, the source of T22 is connected to the first low voltage LVGL.

In the second specific embodiment of the shift register unit shown in FIG. 12, all the transistors are n-type thin film transistors, but not limited thereto.

In the second specific embodiment of the shift register unit shown in FIG. 12, the output terminal I1 is electrically connected to the carry signal output terminal of the adjacent previous stage of shift register unit.

In the second specific embodiment of the shift register unit shown in FIG. 12, the first voltage terminal is a voltage terminal providing the high voltage Vdd, the second voltage terminal is a voltage terminal providing the first low voltage LVGL, the third voltage terminal is a voltage terminal providing the second low voltage VGL.

As shown in FIG. 10, the period T0 of the pull-down control clock signal provided by the pull-down control clock signal terminal D4 is equal to the period T0 of the carry output clock signal provided by D0, the duty ratio of the pull-down control clock signal is equal to that of the carry output clock signal;

the pull-down control clock signal is delayed by T0/2 from the carry output clock signal.

In at least one embodiment of the present disclosure, the duty ratio of the pull-down control clock signal may be 1/4, but is not limited to this.

As shown in FIG. 11, when the second specific embodiment of the shift register unit according to the present disclosure shown in FIG. 12 is operating, the display period includes an input time period t1, an output time period t2, a reset time period t3 and an output cut-off holding time period t4 that are sequentially arranged;

during the input time period t1, I1 provides the high voltage, R1 provides the low voltage, T1 and T2 are turned on, the potential of P11 and the potential of P12 are pulled up; T3 is turned off; T4 and T5 are turned on to control P2 to be connected to LVGL; T7 is turned on so that F1 is connected to the high voltage Vdd, both the source of T8 and the source of T6 are connected to the high voltage Vdd, and thus even if T8 and T6 leak, the potential of P11 and the potential of P12 will not be affected;

during the output time period t2, both I1 and R1 provide the low voltage, T1, T2, T3, and T4 are all turned off; the potential of the first output clock signal provided by D1 and the potential of the second output clock signal provided by D2 rise to the high voltage sequentially. After the potential of the first output clock signal rises to the high voltage and a predetermined time T elapses, the potential of the first output clock signal drops to the low voltage; after the potential of the second output clock signal rises to the high voltage and a predetermined time T elapses, the potential of the second output clock signal drops to the low voltage; when the potential of the first output clock signal rises from the low voltage to the high voltage, the first output clock signal raises the potential of P11 through the bootstrap of C2, and when the potential of the first output clock signal drops from the high voltage to the low voltage, C2 correspondingly controls to pull down the potential of P11; when the potential of the second output clock signal rises from the low voltage to the high voltage, the second output clock signal raises P12 through the bootstrap of C3, and when the potential of the second output clock signal drops from the high voltage to the low voltage, C3 correspondingly controls to pull down the potential of P12;

during the output time period t2, T7 is turned on so that F1 is connected to the high voltage Vdd, both the source of T8 and the source of T6 are connected to the high voltage Vdd, and thus even if T8 and T6 leak, the potential of P11 and the potential of P12 will not be affected; during the input phase t1 and the output phase t2, T91, T93, and T21 are all turned on, so that G1 is electrically connected to the first output clock signal terminal D1, G2 is electrically connected to the second output clock signal terminal D2, and J1 is electrically connected to the carry output clock signal terminal D0;

during the reset time period t3, R1 provides the high voltage, I1 provides the low voltage, T1 and T2 are turned off, T3 is turned on, P2 is connected to the high voltage Vdd, T8 and T6 are turned on to control both P11 and P12 to be connected to LVGL and control T91, T93 and T21 to be all turned off, and T92, T94 and T22 are all turned on, both G1 and G2 output the second low voltage VGL, and J1 outputs the first low voltage LVGL; T9 is turned on so that F1 is connected to the first low voltage LVGL;

during the output cut-off holding time period t4, both R1 and I1 provide the low voltage, T1, T2, T3 and T4 are all turned off, C1 holds the potential of P2 at the high voltage, T92, T94 and T22 are all turned on, both G1 and G2 outputs the second low voltage, and J1 outputs the first low voltage LVGL; T9 is turned on so that F1 is connected to the first low voltage LVGL;

during the output cut-off holding time period t4, the potential of the pull-down control clock signal changes to the high voltage at regular intervals. When the potential of the pull-down control clock signal is a high voltage, T3 is turned on to charge C1 to hold the potential of P2 at the high voltage.

Figure 13:
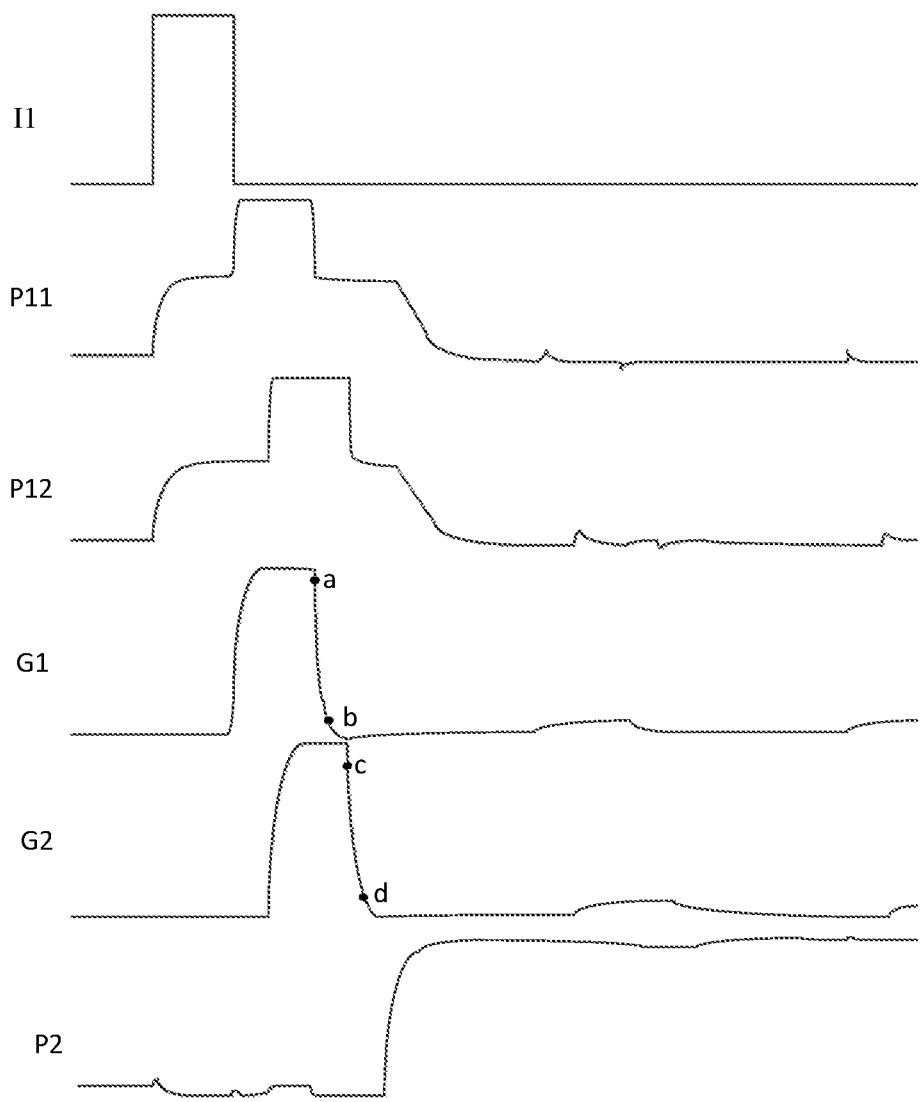
FIG. 13 is a waveform diagram of the potentials of nodes when the threshold voltages of transistors included in the second specific embodiment of the shift register unit of the present disclosure drift to −3V negatively.

As shown in FIG. 13, when the threshold voltage of each transistor included in the second embodiment of the shift register unit shown in FIG. 12 drifts negatively to −3V, the potential of P11, the potential of P12, and the potential of P2 can be held very well, the falling time of the first gate drive signal outputted from G1 is consistent with the falling time of the second gate drive signal from G2.

In FIG. 13, the falling time of the first gate drive signal is the time lasting from point a to point b, and the falling time of the second gate drive signal is the time lasting from point c to point d.

In FIG. 13, the horizontal axis is time, and the vertical axis is potential.

Through simulation, it can be found that, when the threshold voltage of the shift register unit shown in FIG. 12 is between −3.5V and +8V, the falling times of two stages of gate drive signals output by the shift register unit can be kept consistent with each other.

The shift register unit according to at least one embodiment of the present disclosure has a feedback circuit added therein, and can be applied to oxide TFT back panels and LTPS (low temperature polysilicon) back panels.

In at least one embodiment of the present disclosure, description is made by taking the example that the shift register unit in the gate drive circuit adopts n-type transistors; however, in practical operations, the shift register unit may also adopt p-type transistors.

In a specific implementation, the transistors adopted in the gate drive circuit in an oxide TFT back panel are n-type transistors, and the threshold voltage of the n-type transistor may drift positively or negatively. When the threshold voltage of the n-type transistor drifts negatively, leakage will occur. At least one embodiment of the present disclosure can prevent the phenomenon that the potential of the pull-up node cannot be well held due to the leakage of the n-type transistor;

The transistors adopted in the gate drive circuit in an LTPS back panel are p-type transistors. The p-type transistor is prone to leakage due to its high mobility. At least one embodiment of the present disclosure can prevent the phenomenon that the potential of the pull-up node cannot be well held due to the leakage of the p-type transistor.

In at least one embodiment of the present disclosure, description is made by taking the example that all the transistors are n-type transistors.

A driving method of a shift register unit according to at least one embodiment of the present disclosure is used to drive the shift register unit according to at least one embodiment of the present disclosure. The driving method of a shift register unit includes:

the pull-down node control circuit controlling the pull-down node to be electrically conducted to the second voltage terminal, under the control of the input signal provided by the input terminal, the pull-down node control circuit controlling the pull-down node to be electrically conducted to the first voltage terminal, under the control of the reset signal provided by the reset terminal, and the pull-down node control circuit controlling to hold the potential of the pull-down node.

The driving method of a shift register unit according to at least one embodiment of the present disclosure adopts the pull-down node control circuit to control the potential of the pull-down node, which solves the problem of lower circuit reliability caused by that the existing shift register unit needs to use an inverter to control the potential of the pull-down node, making the structure of the shift register unit according to at least one embodiment of the present disclosure simple, reducing the number of transistors used, achieving high PPI (Pixels Per Inch, i.e., the number of pixels per inch), and obtaining higher circuit reliability.

Preferably, the reset signal provided by the reset terminal is a pull-down control clock signal, so that during the reset time period and the output cut-off holding time period, the pull-down control circuit can control to hold the potential of the pull-down node better.

Preferably, the shift register unit further includes a setting circuit, a pull-up node potential holding circuit, and N pull-up nodes; the setting circuit includes N setting sub-circuits connected in series with each other, wherein N is an integer greater than or equal to 2; the pull-up node potential holding circuit includes N potential holding sub-circuits; the driving method of a shift register unit further includes:

the first setting sub-circuit controlling the first pull-up node to be electrically conducted to the first voltage terminal, under the control of the input signal; a first potential holding sub-circuit holding a potential of the first pull-up node;

the n-th setting sub-circuit controlling the (n−1)-th pull-up node to be electrically conducted to the n-th pull-up node, under the control of the input signal; an n-th potential holding sub-circuit holding a potential of the n-th pull-up node.

In at least one embodiment of the present disclosure, the shift register unit may include a setting circuit, and the setting circuit includes N setting sub-circuits connected in series with each other, the multiple stages of setting sub-circuits connected in series with each other provide the potentials of the pull-up nodes, respectively, and each of the pull-up nodes controls the output of the corresponding stage of gate drive signal, so as to reduce the difference in falling time tf of all stages of gate drive signals output by the shift register unit.

Optionally, the shift register unit may include a feedback circuit and a pull-down circuit;

the driving method of a shift register unit further includes:
the pull-down circuit controlling the N pull-up nodes to be electrically conducted to the feedback node, respectively, under the control of the potential of the pull-down node;

the feedback circuit controlling the feedback node to be electrically conducted to the first voltage terminal, under the control of the potential of the first pull-up node, and controlling the feedback node to be electrically conducted to the second voltage terminal, under the control of the potential of the pull-down node.

In a specific implementation, the shift register unit further includes a drive output circuit and N gate drive signal output terminals; the drive output circuit includes N drive output sub-circuits; the driving method of a shift register unit further includes:

a first drive output sub-circuit controlling the first gate drive signal output terminal to be electrically conducted to the first output clock signal terminal, under the control of the potential of the first pull-up node, and controlling the first gate drive signal output terminal to be electrically conducted to the third voltage terminal, under the control of the potential of the pull-down node;

an n-th drive output sub-circuit controlling the n-th gate drive signal output terminal to be electrically conducted to the n-th output clock signal terminal, under the control of the potential of the n-th pull-up node, and controlling the n-th gate drive signal output terminal to be electrically conducted to the third voltage terminal, under the control of the potential of the pull-down node.

In at least one embodiment of the present disclosure, the shift register unit may further include a carry signal output terminal and a carry signal output circuit; the driving method of a shift register unit may further includes:

the carry signal output circuit controlling the carry signal output terminal to be electrically conducted to the carry output clock signal terminal, under the control of the potential of the first pull-up node, and controlling the carry signal output terminal to be electrically conducted to the second voltage terminal, under the control of the potential of the pull-down node.

A gate drive circuit according to at least one embodiment of the present disclosure includes multiple stages of the above shift register units;

the shift register unit includes a carry signal output terminal;

except for the first stage of shift register unit, an input terminal of each stage of shift register unit is electrically connected to the carry signal output terminal of an adjacent previous stage of shift register unit.

Figure 14:
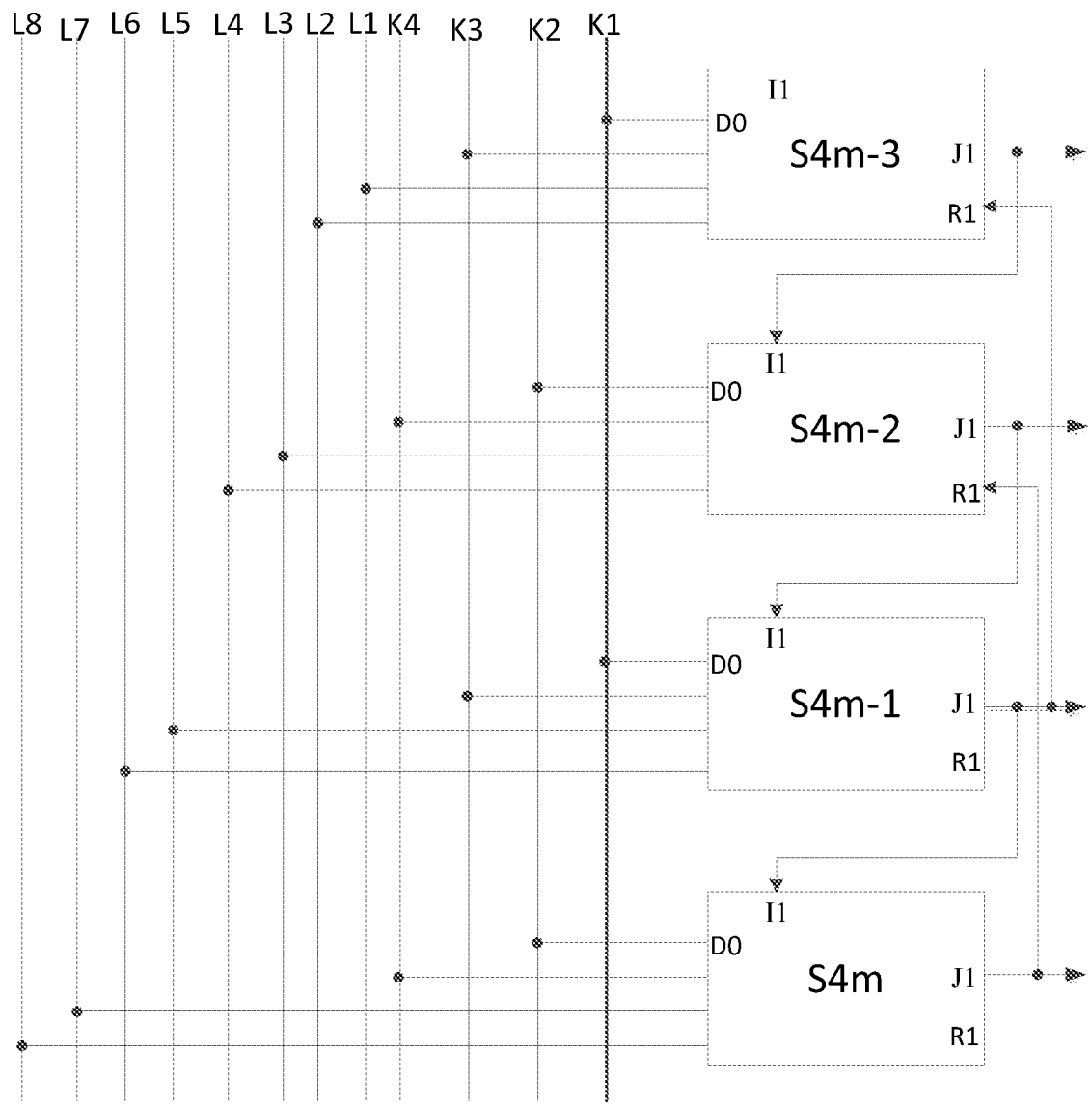
FIG. 14 is a schematic diagram of a connection relationship of a four-stage shift register unit included in a gate driving circuit according to at least one embodiment of the present disclosure.

FIG. 14 shows a four-stage shift register unit included in the gate drive circuit according to at least one embodiment of the present disclosure;

As shown in FIG. 14, the shift register unit labeled S4$m$−3 is the (4m−3)-th stage of shift register unit included in the gate drive circuit, the shift register unit labeled S4$m$−2 is the (4m−2)-th stage of shift register unit included in the gate drive circuit, the shift register unit labeled S4$m$−1 is the (4m−1)-th stage of shift register unit included in the gate drive circuit, and the shift register unit labeled S4$m$ is the 4m-th stage of shift register unit included in the gate drive circuit, where m is a positive integer;

the carry output clock signal terminal D0 of S4$m$−3 is connected to the first clock signal K1; S4$m$−3 may also be connected to the third clock signal K3;

the carry output clock signal terminal D0 of S4$m$−2 is connected to the second clock signal K2; S4$m$−2 may also be connected to the fourth clock signal K4;

the carry output clock signal terminal D0 of S4$m$−1 is connected to the first clock signal K1; S4$m$−1 may also be connected to the third clock signal K3;

the carry output clock signal terminal D0 of S4$m$ is connected to the second clock signal K2; S4$m$ may also be connected to the fourth clock signal K4;

the carry signal output terminal J1 of S4$m$−3 is electrically connected to the input terminal I1 of S4$m$−2;

the carry signal output terminal J1 of S4$m$−2 is electrically connected to the input terminal I1 of S4$m$−2;

the carry signal output terminal J1 of S4$m$−1 is electrically connected to the reset terminal R1 of S4$m$−3;

the carry signal output terminal J1 of S4$m$ is electrically connected to the reset terminal R1 of S4$m$−2.

Moreover, in the four-stage shift register unit included in the gate drive circuit shown in FIG. 14, the first output clock signal terminal of S4$m$−1 is connected to the first output clock signal L1, the second output clock signal terminal of S4$m$−1 is connected to the second output clock signal L2; the first output clock signal terminal of S4$m$−2 is connected to the third output clock signal L3, the second output clock signal terminal of S4$m$−2 is connected to the fourth output clock signal L4; the first output clock signal terminal of S4$m$−3 is connected to the fifth output clock signal L5, the second output clock signal terminal of S4$m$−3 is connected to the sixth output clock signal L6; the first output clock signal terminal of S4$m$ is connected to the seventh output clock signal L7, the second output clock signal terminal of S4$m$ is connected to the eighth output clock signal L8.

Figure 15:
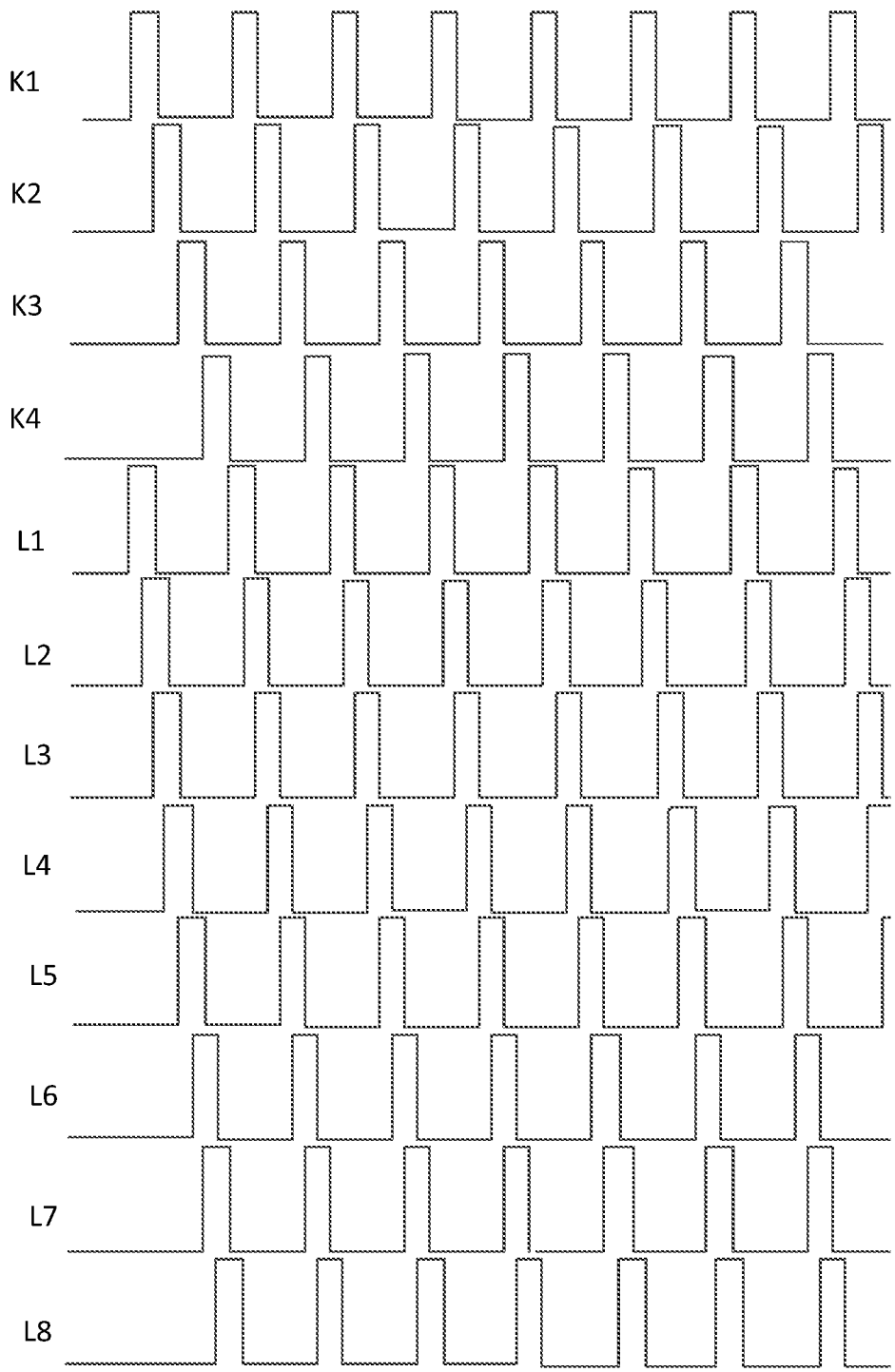
FIG. 15 is a waveform diagram of clock signals used in a gate driving circuit according to at least one embodiment of the present disclosure.

As shown in FIG. 15, all the periods of K1, K2, K3, K4, L1, L2, L3, L4, L5, L6, L7 and L8 are T;

all the duty ratios of K1, K2, K3, K4, L1, L2, L3, L4, L5, L6, L7 and L8 are 1/4;

K2 is delayed by T/4 from K1, K3 is delayed by T/4 from K2, K4 is delayed by T/4 from K3;

L1 is delayed by T/4 from K4, L2 is delayed by T/8 from L1, L3 is delayed by T/8 from L2, L4 is delayed by T/8 from L3, L5 is delayed by T/8 from L4, L6 is delayed by T/8 from L5, L7 is delayed by T/8 from L6, L8 is delayed by T/8 from L7.

A display device according to at least one embodiment of the present disclosure includes the above gate drive circuit.

The display device provided in at least one embodiment of the present disclosure may be any product or component with a display function, such as a mobile phone, a tablet, a television, a monitor, a notebook, a digital photo frame, or a navigator.

The above are the preferred embodiments of the present disclosure. It should be pointed out that for those of ordinary skill in the art, without departing from the principles described in the present disclosure, several improvements and modifications can be made, and these improvements and modifications should be also regarded as the protection scope of the disclosure.

What is claimed is:

1. A shift register unit, comprising a pull-down node control circuit;

the pull-down node control circuit being electrically connected to an input terminal, a reset terminal, a first voltage terminal, a second voltage terminal and a pull-down node, respectively, and being configured to, under the control of an input signal provided by the input terminal and a reset signal provided by the reset terminal, control the pull-down node to be electrically conducted to the first voltage terminal or the second voltage terminal, and control to hold a potential of the pull-down node, wherein the shift register unit further comprises a setting circuit, a pull-up node potential holding circuit, and N pull-up nodes;

the setting circuit comprises N setting sub-circuits connected in series with each other, wherein N is an integer greater than or equal to 2; the pull-up node potential holding circuit comprises N potential holding sub-circuits;

a control terminal of a first setting sub-circuit is electrically connected to the input terminal, a first terminal of the first setting sub-circuit is electrically connected to the first voltage terminal, a second terminal of the first setting sub-circuit is electrically connected to a first pull-up node, the first setting sub-circuit is configured to, under the control of the input signal, control the first pull-up node to be electrically conducted to the first voltage terminal;

a control terminal of an n-th setting sub-circuit is electrically connected to the input terminal, a first terminal of the n-th setting sub-circuit is electrically connected to an (n−1)-th pull-up node, a second terminal of the n-th setting sub-circuit is electrically connected to an n-th pull-up node; the n-th setting sub-circuit is configured to, under the control of the input signal, control the (n−1)-th pull-up node to be electrically conducted to the n-th pull-up node; n is an integer greater than 1 and less than or equal to N;

a first potential holding sub-circuit is electrically connected to the first pull-up node, and is configured to hold a potential of the first pull-up node;

an n-th potential holding sub-circuit is electrically connected to the n-th pull-up node, and is configured to hold a potential of the n-th pull-up node.

2. The shift register unit according to claim 1, wherein the pull-down node control circuit comprises a first control sub-circuit, a second control sub-circuit, and an energy storage circuit;

the first control sub-circuit is electrically connected to the reset terminal, the pull-down node and the first voltage terminal, respectively, and is configured to, under the control of the reset signal, control the pull-down node to be electrically conducted to the first voltage terminal;

the second control sub-circuit is electrically connected to the input terminal, the pull-down node and the second voltage terminal, respectively, and is configured to, under the control of the input signal, control the pull-down node to be electrically conducted to the second voltage terminal;

the energy storage circuit is electrically connected to the pull-down node, and is configured to hold the potential of the pull-down node.

3. The shift register unit according to claim 2, wherein the first control sub-circuit comprises a first control transistor, the second control sub-circuit comprises a second control transistor, the energy storage circuit comprises a storage capacitor;

a control electrode of the first control transistor is electrically connected to the reset terminal, a first electrode of the first control transistor is electrically connected to the first voltage terminal, a second electrode of the first control transistor is electrically connected to the pull-down node;

a control electrode of the second control transistor is electrically connected to the input terminal, a first electrode of the second control transistor is electrically connected to the pull-down node, a second electrode of the second control transistor is electrically connected to the second voltage terminal;

a first terminal of the storage capacitor is electrically connected to the pull-down node, a second terminal of the storage capacitor is electrically connected to the second voltage terminal.

4. The shift register unit according to claim 3, wherein the second control sub-circuit further comprises a third control transistor;

the second electrode of the second control transistor is electrically connected to the second voltage terminal via the third control transistor;

a control electrode of the third control transistor is electrically connected to the input terminal, a first electrode of the third control transistor is electrically connected to the second electrode of the second control transistor, a second electrode of the third control transistor is electrically connected to the second voltage terminal.

5. The shift register unit according to claim 3, wherein the reset signal provided by the reset terminal is a pull-down control clock signal.

6. The shift register unit according to claim 1, wherein the shift register unit further comprises N gate drive signal output terminals; the first setting sub-circuit comprises a first setting transistor; the n-th setting sub-circuit comprises an n-th setting transistor; the first potential holding sub-circuit comprises a first energy storage capacitor, the n-th potential holding sub-circuit comprises an n-th energy storage capacitor;

a control electrode of the first setting transistor is electrically connected to the input terminal, a first electrode of the first setting transistor is electrically connected to the first voltage terminal, a second electrode of the first setting transistor is electrically connected to the first pull-up node;

a control electrode of the n-th setting transistor is electrically connected to the input terminal, a first electrode of the n-th setting transistor is electrically connected to the (n−1)-th pull-up node, a second electrode of the n-th setting transistor is electrically connected to the n-th pull-up node;

a first terminal of the first energy storage capacitor is electrically connected to the first pull-up node, a second terminal of the first energy storage capacitor is electrically connected to a first gate drive signal output terminal;

a first terminal of the n-th energy storage capacitor is electrically connected to the n-th pull-up node, a second terminal of the n-th energy storage capacitor is electrically connected to an n-th gate drive signal output terminal.

7. The shift register unit according to claim 1, wherein the shift register unit further comprises a pull-down circuit;

the pull-down circuit is electrically connected to the pull-down node, the N pull-up nodes and the second voltage terminal, respectively, and is configured to, under the control of the potential of the pull-down node, control the N pull-up nodes to be electrically conducted to the second voltage terminal, respectively.

8. The shift register unit according to claim 1, wherein the shift register unit comprises a feedback circuit and a pull-down circuit;

the pull-down circuit is electrically connected to the pull-down node, the N pull-up nodes and a feedback node, respectively, and is configured to, under the control of the potential of the pull-down node, control the N pull-up nodes to be electrically conducted to the feedback node, respectively;

the feedback circuit is electrically connected to the first pull-up node, the feedback node, the first voltage terminal and the second voltage terminal, respectively, and is configured to, under the control of the potential of the first pull-up node, control the feedback node to be electrically conducted to the first voltage terminal, and under the control of the potential of the pull-down node, control the feedback node to be electrically conducted to the second voltage terminal.

9. The shift register unit according to claim 8, wherein the feedback circuit comprises a first feedback transistor and a second feedback transistor;
a control electrode of the first feedback transistor is electrically connected to the first pull-up node, a first electrode of the first feedback transistor is electrically connected to the first voltage terminal, a second electrode of the first feedback transistor is electrically connected to the feedback node;
a control electrode of the second feedback transistor is electrically connected to the pull-down node, a first electrode of the second feedback transistor is electrically connected to the feedback node, a second electrode of the second feedback transistor is electrically connected to the second voltage terminal.

10. The shift register unit according to claim 1, wherein the shift register unit further comprises a drive output circuit and N gate drive signal output terminals; the drive output circuit comprises N drive output sub-circuits;
a first drive output sub-circuit is electrically connected to a first gate drive signal output terminal, the first pull-up node, the pull-down node, a first output clock signal terminal and a third voltage terminal, respectively, and is configured to, under the control of the potential of the first pull-up node, control the first gate drive signal output terminal to be electrically conducted to the first output clock signal terminal, and under the control of the potential of the pull-down node, control the first gate drive signal output terminal to be electrically conducted to the third voltage terminal;
an n-th drive output sub-circuit is electrically connected to an n-th gate drive signal output terminal, the n-th pull-up node, the pull-down node, an n-th output clock signal terminal and the third voltage terminal, respectively, and is configured to, under the control of the potential of the n-th pull-up node, control the n-th gate drive signal output terminal to be electrically conducted to the n-th output clock signal terminal, and under the control of the potential of the pull-down node, control the n-th gate drive signal output terminal to be electrically conducted to the third voltage terminal.

11. The shift register unit according to claim 1, wherein the shift register unit further comprises a carry signal output terminal and a carry signal output circuit;
the carry signal output circuit is electrically connected to the first pull-up node, the pull-down node, a carry output clock signal terminal, the carry signal output terminal and the second voltage terminal, respectively, and is configured to, under the control of the potential of the first pull-up node, control the carry signal output terminal to be electrically conducted to the carry output clock signal terminal, and under the control of the potential of the pull-down node, control the carry signal output terminal to be electrically conducted to the second voltage terminal.

12. A driving method of a shift register unit for driving the shift register unit according to claim 1, the driving method of a shift register unit comprising:
the pull-down node control circuit controlling the pull-down node to be electrically conducted to the second voltage terminal, under the control of the input signal provided by the input terminal, the pull-down node control circuit controlling the pull-down node to be electrically conducted to the first voltage terminal, under the control of the reset signal provided by the reset terminal, and the pull-down node control circuit controlling to hold the potential of the pull-down node,
a first setting sub-circuit controlling a first pull-up node to be electrically conducted to the first voltage terminal, under the control of the input signal; a first potential holding sub-circuit holding a potential of the first pull-up node;
an n-th setting sub-circuit controlling an (n−1)-th pull-up node to be electrically conducted to an n-th pull-up node, under the control of the input signal; an n-th potential holding sub-circuit holding a potential of the n-th pull-up node.

13. The driving method of a shift register unit according to claim 12, wherein the reset signal provided by the reset terminal is a pull-down control clock signal.

14. The driving method of a shift register unit according to claim 12, wherein the shift register unit comprises a feedback circuit and a pull-down circuit;
the driving method of a shift register unit further comprises:
the pull-down circuit controlling the N pull-up nodes to be electrically conducted to a feedback node, respectively, under the control of a potential of the pull-down node;
the feedback circuit controlling the feedback node to be electrically conducted to the first voltage terminal, under the control of a potential of the first pull-up node, and controlling the feedback node to be electrically conducted to the second voltage terminal, under the control of the potential of the pull-down node.

15. The driving method of a shift register unit according to claim 12, wherein the shift register unit further comprises a drive output circuit and N gate drive signal output terminals; the drive output circuit comprises N drive output sub-circuits; the driving method of a shift register unit further comprises:
a first drive output sub-circuit controlling a first gate drive signal output terminal to be electrically conducted to the first output clock signal terminal, under the control of the potential of the first pull-up node, and controlling the first gate drive signal output terminal to be electrically conducted to a third voltage terminal, under the control of a potential of the pull-down node;
an n-th drive output sub-circuit controlling an n-th gate drive signal output terminal to be electrically conducted to an n-th output clock signal terminal, under the control of the potential of the n-th pull-up node, and controlling the n-th gate drive signal output terminal to be electrically conducted to the third voltage terminal, under the control of the potential of the pull-down node.

16. The driving method of a shift register unit according to claim 12, wherein the shift register unit further comprises a carry signal output terminal and a carry signal output circuit; the driving method of a shift register unit further comprises:
the carry signal output circuit controlling the carry signal output terminal to be electrically conducted to a carry output clock signal terminal, under the control of a potential of the first pull-up node, and controlling the carry signal output terminal to be electrically conducted to the second voltage terminal, under the control of a potential of the pull-down node.

17. A gate drive circuit comprising multiple stages of the shift register units according to claim 1;
the shift register unit comprises a carry signal output terminal;

except for a first stage of shift register unit, an input terminal of each stage of shift register unit is electrically connected to the carry signal output terminal of an adjacent previous stage of shift register unit.

18. A display device comprising the gate drive circuit according to claim 17.

\* \* \* \* \*